United States Patent
Jenkins et al.

(10) Patent No.: US 9,528,270 B2
(45) Date of Patent: *Dec. 27, 2016

(54) PHOTOVOLTAIC ROOFING SYSTEMS WITH INSIDE CORNER FLASHINGS

(71) Applicant: CertainTeed Corporation, Valley Forge, PA (US)

(72) Inventors: Robert L. Jenkins, Honeybrook, PA (US); Christopher C. Fisher, Philadelphia, PA (US)

(73) Assignee: Certain Teed Corporation, Malvern, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/553,626

(22) Filed: Nov. 25, 2014

(65) Prior Publication Data

US 2015/0075087 A1 Mar. 19, 2015

Related U.S. Application Data

(63) Continuation of application No. 13/910,150, filed on Jun. 5, 2013, now Pat. No. 8,898,970.

(60) Provisional application No. 61/658,482, filed on Jun. 12, 2012.

(51) Int. Cl.
| | |
|---|---|
| *E04D 13/18* | (2014.01) |
| *E04H 14/00* | (2006.01) |
| *E04D 13/00* | (2006.01) |
| *H02S 20/23* | (2014.01) |
| *H01L 31/0475* | (2014.01) |
| *E04B 7/18* | (2006.01) |
| *F24J 2/52* | (2006.01) |

(52) U.S. Cl.
CPC .............. *E04D 13/00* (2013.01); *E04B 7/18* (2013.01); *H01L 31/0475* (2014.12); *H02S 20/23* (2014.12); *F24J 2002/5294* (2013.01); *F24J 2002/5296* (2013.01); *Y02B 10/12* (2013.01); *Y02E 10/50* (2013.01)

(58) Field of Classification Search
CPC .. E04D 13/00; H04L 31/0475; H04L 31/0482; H02S 20/23; E04B 7/18; F24J 2002/5294; F24J 2002/5296; Y02B 10/12; Y02E 10/50
USPC ............... 52/173.3, 302.6, 58, 60, 518, 556, 560,52/579, 748.1; 136/243, 244
See application file for complete search history.

(56) References Cited

U.S. PATENT DOCUMENTS

| | | |
|---|---|---|
| 3,579,940 A | 5/1971 | Greenleaf |
| 5,457,057 A | 10/1995 | Nath et al. |
| 5,968,287 A | 10/1999 | Nath |
| 7,012,188 B2 | 3/2006 | Erling |
| 7,138,578 B2 | 11/2006 | Komamine |
| 8,141,306 B2 | 3/2012 | Masuda et al. |
| 8,601,754 B2 | 12/2013 | Jenkins et al. |
| 8,631,614 B2 | 1/2014 | Livsey et al. |
| 8,898,970 B2 | 12/2014 | Jenkins et al. |
| 2006/0196128 A1 | 9/2006 | Duke |
| 2008/0289272 A1 | 11/2008 | Flaherty et al. |

(Continued)

FOREIGN PATENT DOCUMENTS

WO 2006/043658 4/2006

*Primary Examiner* — Brian Mattei
(74) *Attorney, Agent, or Firm* — McDonnell Boehnen Hulbert & Berghoff LLP

(57) ABSTRACT

The present invention relates particularly to photovoltaic roofing products for use in photovoltaically generating electrical energy and provides inside corner flashings useful for flashing photovoltaic roofing systems in which photovoltaic roofing elements are disposed in a staggered configuration.

17 Claims, 22 Drawing Sheets

(56) References Cited

U.S. PATENT DOCUMENTS

| | | |
|---|---|---|
| 2008/0302030 A1 | 12/2008 | Stancel et al. |
| 2008/0313976 A1 | 12/2008 | Allen |
| 2010/0065108 A1 | 3/2010 | West et al. |
| 2010/0313499 A1 | 12/2010 | Gangemi |
| 2010/0313501 A1 | 12/2010 | Gangemi |
| 2011/0017278 A1 | 1/2011 | Kalkanoglu et al. |
| 2011/0083381 A1 | 4/2011 | David et al. |
| 2011/0094170 A1 | 4/2011 | Kalkanoglu et al. |
| 2012/0186630 A1 | 7/2012 | Jenkins et al. |
| 2012/0210660 A1 | 8/2012 | Livsey et al. |
| 2012/0240490 A1 | 9/2012 | Gangemi |

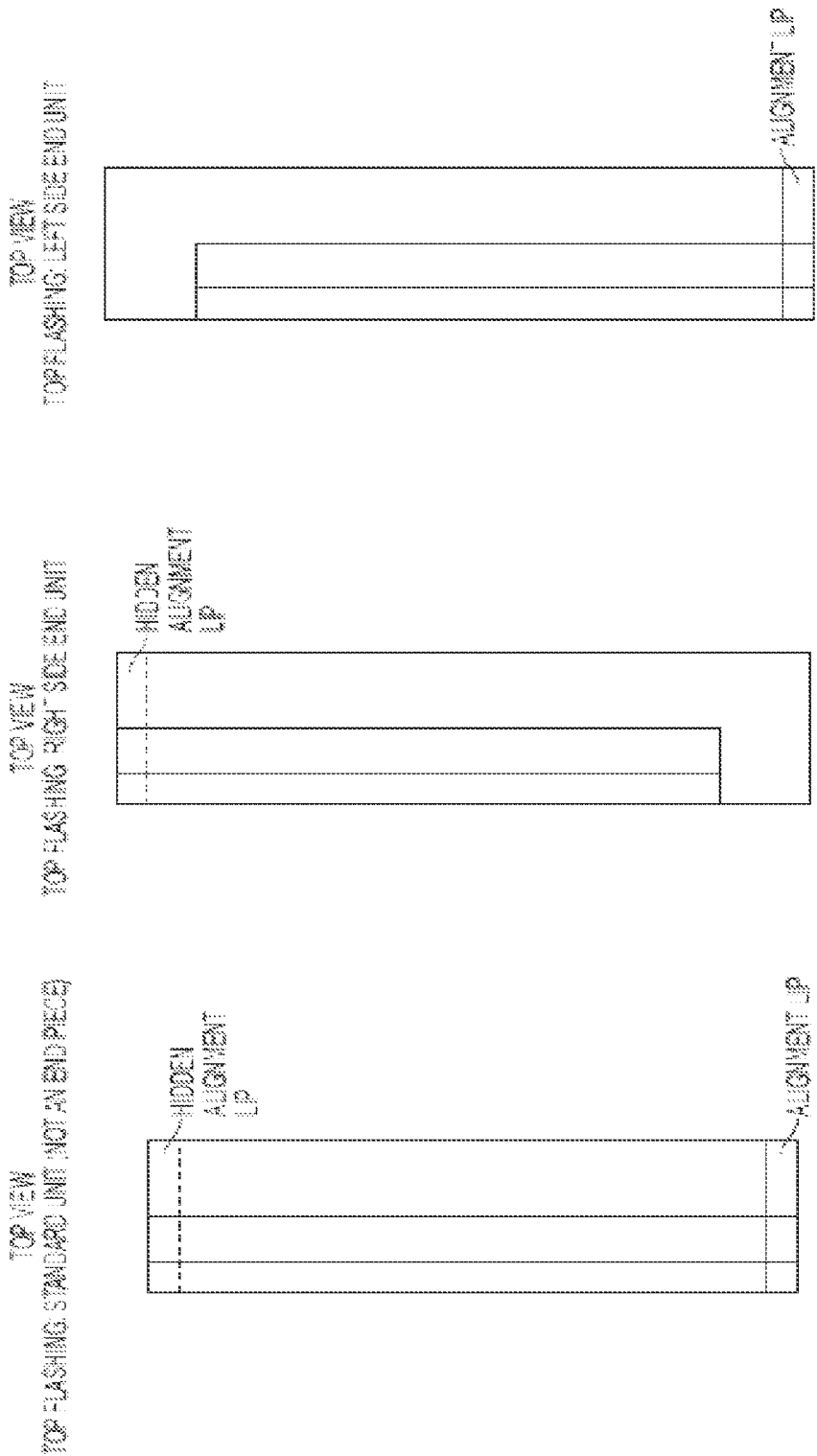

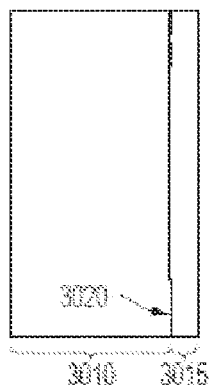
TOP VIEW
BACK VIEW
FRONT VIEW
SIDE VIEW
FIG. 30

PHOTOVOLTAIC ROOFING SYSTEMS WITH INSIDE CORNER FLASHINGS

CROSS-REFERENCE TO RELATED APPLICATIONS

This application is a continuation of U.S. application Ser. No. 13/910,150, filed Jun. 5, 2013, issued Dec. 2, 2014 as U.S. Pat. No. 8,898,970, which claims benefit of U.S. Provisional Patent Application Ser. No. 61/658,482, filed Jun. 12, 2012, the contents of each of which are hereby incorporated by reference.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used, for example, to provide at least a significant fraction of the electrical energy needed for a building's overall function; or they can be used to power one or more particular devices, such as exterior lighting systems and well pumps.

Accordingly, research and development attention has turned toward the development of photovoltaic products that are adapted to be installed on a roof. While stand-alone photovoltaic modules have been in use for some time, they tend to be heavy and bulky, and aesthetically unfavorable when installed on a roof. Roofing products having photovoltaic cells integrated with roofing products such as shingles, shakes or tiles, or roofing panels have been proposed. Examples of such proposals have been disclosed in U.S. Patent Application Publications nos. 2006/0042683A1, 2008/0149163A1, 2010/0313499A1 and 2010/0313501A1, and in U.S. Pat. No. 4,040,867, each of which is hereby incorporated by reference herein in its entirety. A plurality of such photovoltaic roofing elements (i.e., including photovoltaic media integrated with a roofing product) can be installed together on a roof, and electrically interconnected to form a photovoltaic roofing system that provides both environmental protection and photovoltaic power generation. These can be very advantageous, but can be difficult to install on steep surfaces, while ensuring sufficient closure of the roof against the elements, particularly wind driven rain, and can often result in incomplete coverage of the roof surface with photovoltaic power generation. Moreover, as it is often desirable to have photovoltaic roofing elements covering a portion of a roof surface and conventional roofing products covering the remainder of the surface, there is a need for systems that provide aesthetic effect in the transition zone between the conventional roofing products and the photovoltaic roofing elements while closing the roof and the array of photovoltaic roofing elements to the environment.

Individual photovoltaic roofing elements within a larger photovoltaic roofing system are often electrically interconnected using wiring such as wires or cables. Similarly, wiring is often used to connect the array to an electrical system. But in many systems, the wiring is at risk of being dislocated, being damaged, or being pinched or bent into a radius tighter than allowed by code during handling and installation. This risk is especially high when the photovoltaic roofing element includes support structures such as downward-facing ribs, as the installer may not be able to determine if wiring is pinched between the support structure and the underlying roof deck. Damaged wire can cause power loss over time, injury, or fire, and is therefore undesirable.

There remains a need for photovoltaic products that address one or more of these deficiencies.

SUMMARY OF THE INVENTION

In one aspect, the present invention provides a photovoltaic roofing system disposed on a roof deck having a top end and a bottom end. The photovoltaic roofing system includes a first course including one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, and two side edges. The photovoltaic roofing system further includes a second course horizontally offset from the first course, the second course including one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge disposed up the roof from the top edge of the one or more contiguously-disposed photovoltaic roofing elements of the first course, thereby forming an inside corner; and a second side edge opposing the first side edge. The photovoltaic roofing system further includes an inside corner flashing element having a top edge, a first horizontal portion having a first side edge and a bottom edge, a second horizontal portion horizontally adjacent the first horizontal portion, the second horizontal portion having a second side edge opposing the first side edge and a bottom edge adjacent the bottom edge of the first horizontal portion, the first horizontal portion comprising a horizontally-extending flange forming a water-resistant interface with the photovoltaic roofing element at the first side edge of the second course, the second horizontal portion overlapping the top edge of a photovoltaic roofing element of the first course. The photovoltaic roofing system further includes a roofing element disposed adjacent the first side edge of the second course and on top of the second horizontal portion of the inside corner flashing element.

Another aspect of the invention is an inside corner flashing element adapted for use with a photovoltaic roofing system that includes a first course comprising one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, and two side edges; and a second course horizontally offset from the first course, the second course comprising one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge disposed up the roof from the top edge of the one or more contiguously-disposed photovoltaic roofing elements of the first course, thereby forming an inside corner; and a second side edge opposing the first side edge; and a roofing element disposed adjacent the first side edge of the second course, The inside corner flashing element includes a top edge, a first horizontal portion having a first side edge and a bottom edge, a second horizontal portion horizontally adjacent the first horizontal portion, the second horizontal portion having a second side edge opposing the first side edge and a bottom edge adjacent the bottom edge of the first horizontal portion, the first horizontal portion comprising a horizontally-extending flange, the horizontally-extending flange being adapted to form a water-resistant interface with the photovoltaic roofing element at the first side edge of the second course, the second horizontal portion being adapted to overlap the top edge of a photovoltaic roofing element of the first course and to underlie the roofing element disposed adjacent the first side edge of the second course.

BRIEF DESCRIPTION OF THE DRAWINGS

The accompanying drawings are not necessarily to scale, and sizes of various elements can be distorted for clarity.

FIGS. 27, 28 and 29 are top schematic views and edge schematic views of examples of top flashing elements for closing the top portion of the array of photovoltaic roofing elements according to one embodiment of the invention;

FIGS. 30 and 31 are sets of schematic views (top, back, side, front and perspective) of side flashing elements suitable for use in certain embodiments of the invention.

DETAILED DESCRIPTION OF THE INVENTION

Photovoltaic roofing systems can be formed from a plurality of photovoltaic roofing elements disposed contiguously on a roof deck, and flashed into a field of conventional roofing materials. Examples of such systems are described, for example, in U.S. patent application Ser. Nos. 13/326,081, 13/326,094 and 61/559,614, each of which is hereby incorporated herein by reference in its entirety.

Figure 1:
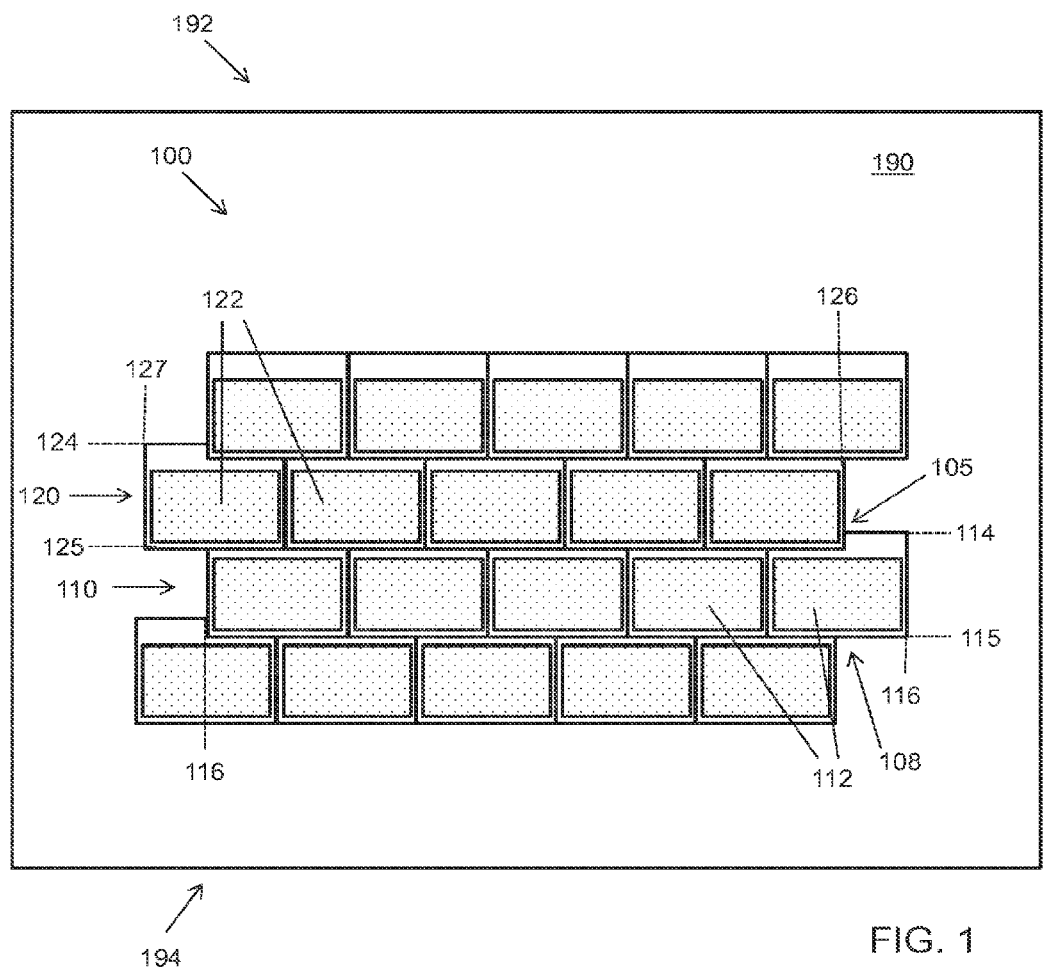
FIG. 1 is a schematic plan view of a photovoltaic roofing system including photovoltaic roofing elements disposed on a roof deck.

Flashing can be complicated somewhat when the overall array of photovoltaic roofing elements has various rows (or "courses") offset from one another. For example, when the roof area has a triangular, trapezoidal, or otherwise non-rectangular shape, use of a non-rectangular array of photovoltaic roofing elements can help to maximize the overall area of the photovoltaic material on the roof. Even when a roof area is rectangular, in many systems the photovoltaic roofing elements are designed to be installed in offset rows. Accordingly, in many photovoltaic roofing systems, an overall array of contiguously disposed photovoltaic roofing elements can have "inside corners." FIG. 1 is a schematic plan view of a photovoltaic roofing system formed from offset courses of photovoltaic roofing elements disposed on a roof deck 190 having a top end 192 (i.e., up the roof) and a bottom end 194 (i.e., down the roof). In the example of FIG. 1, photovoltaic roofing system 100 includes a first course 110 including one or more (here, five) photovoltaic roofing elements 112, contiguously disposed in a horizontal row. Together the photovoltaic roofing elements of the first course have a top edge 114 facing the top end of the roof deck, a bottom edge 115 facing the bottom end of the roof deck; and two side edges 116. The photovoltaic roofing system also includes a second course 120 horizontally offset from the first course. The second course 120 includes one or more (here, five) photovoltaic roofing elements 122, contiguously disposed in a horizontal row on the roof deck. Together the photovoltaic roofing elements of the second course have a top edge 124 facing the top end of the roof deck, a bottom edge 125 facing the bottom end of the roof deck; and a first side edge 126; and a second side edge 127 opposing the first side edge. The bottom edge 125 of the second course at least partially overlaps the top edge 114 of the of the photovoltaic roofing elements of the first course. The first side edge 126 is disposed up the roof from the top edge of the first course, thus forming an inside corner 105. While the rows of FIG. 1 are shown as being the same length, the person of skill in the art will understand that in other embodiments the various courses have different lengths. Moreover, the courses need not be disposed precisely horizontally; a "horizontal row" can have some deviation from true horizontal.

In certain embodiments, an inside corner forms an angle of about 90° (i.e., between the first side edge of the photovoltaic roofing elements of the second course and the horizontal axis of the first course of photovoltaic roofing elements). Such an embodiment is illustrated in FIG. 1. In other embodiments, an inside corner forms a different angle (e.g., about ±60°, about ±45°, or about)±30°.

Figure 1A:
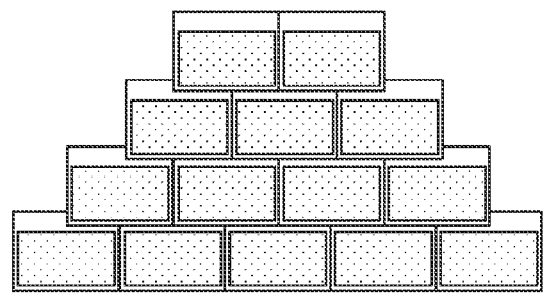
FIGS. 1A, 1B and 1C are schematic plain views of arrays of photovoltaic roofing elements.
Figure 1B:
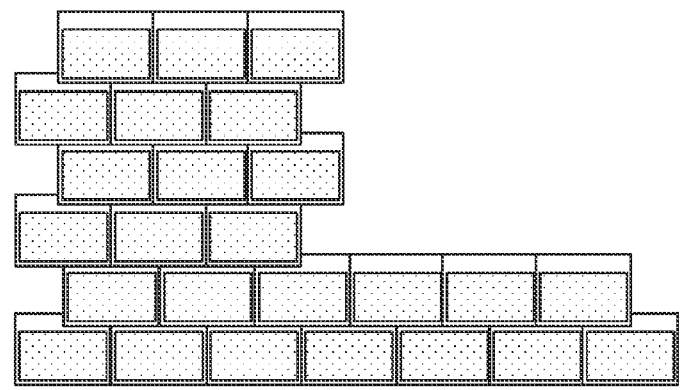
Figure 1C:
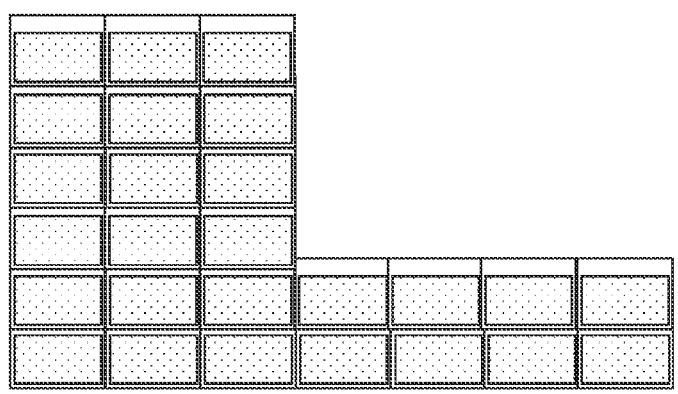

Certain aspects of the present invention are suitable for use with a wide variety of overall shapes of photovoltaic roofing systems. For example, as shown in the schematic plan view of FIG. 1A, the array of photovoltaic roofing elements can be arranged in a trapezoidal shape. In an alternative arrangement, shown in FIG. 1B, the array of photovoltaic roofing elements forms an "L" shape, which can be suitable for providing increased photovoltaic roof coverage when the roof has a protrusion or an obstacle thereon, such as a dormer or roof-mounted equipment such as an air conditioner. FIG. 1C shows another "L" shaped configuration in which the photovoltaic elements of different courses are laterally aligned with one another, as opposed to being laterally offset from one another as in the embodiment of FIG. 1B. Similarly, certain aspects of the present invention can be suitable for use at a valley formed on a roof. Of course, the person of skill in the art will recognize that virtually any overall array shape can be used in conjunction with various aspects of the present invention.

Figure 2:
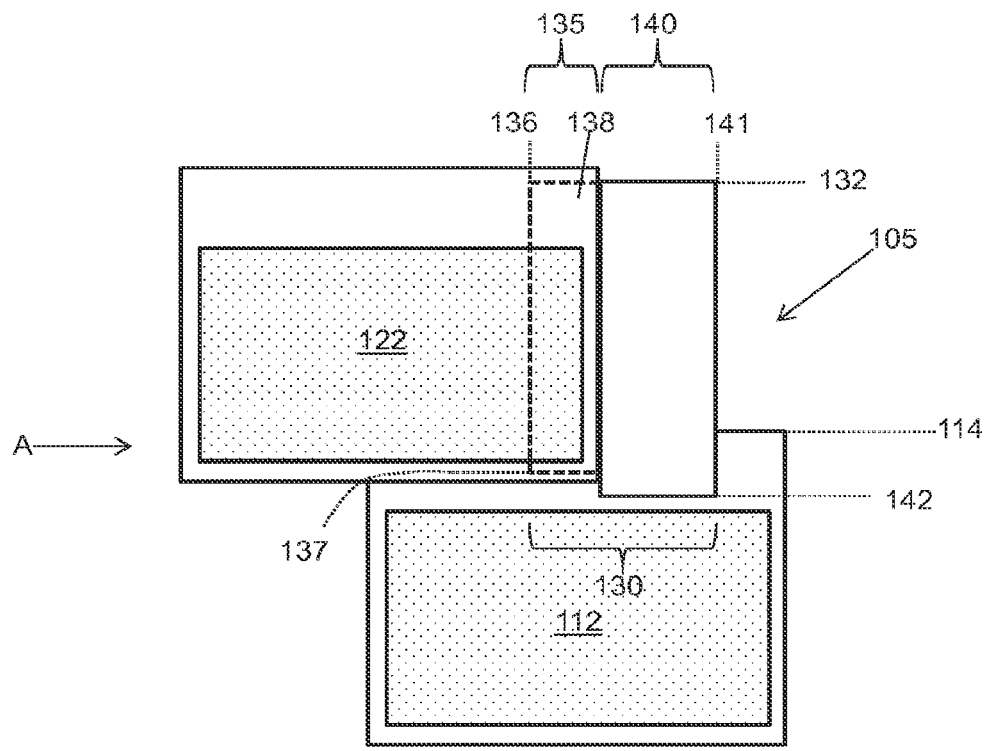
FIG. 2 is a partial schematic plan view of a photovoltaic roofing system according to one embodiment of the invention

One embodiment of the invention is shown in partial schematic view in FIG. 2. In this embodiment, the first and second courses of the photovoltaic roofing system are substantially as described in FIG. 1; the view of FIG. 2 focuses on the region of the inside corner, with an endmost photovoltaic roofing element of each of the first and second courses (112 and 122, respectively). In the photovoltaic roofing system of FIG. 2, an inside corner flashing element 130 is disposed in the inside corner 105. The inside corner flashing element has a top edge 132, a first horizontal portion 135 and a second horizontal portion 140 horizontally adjacent the first horizontal portion. The first horizontal portion has a first side edge 136 and a bottom edge 137. The second horizontal portion has a second side edge 141 opposing the first side edge; and a bottom edge 142 adjacent the bottom edge of the first horizontal portion. The first horizontal portion 135 includes a horizontally-extending flange 138 that forms a water-resistant interface with the photovoltaic roofing element at the first side edge of the second course. In this embodiment, horizontally-extending flange 138 is disposed under the photovoltaic roofing element 122 at the first side edge of the second course, and overlapping the top edge 114 of the a photovoltaic roofing element of the first course. The second horizontal portion 140 overlaps the top edge 114 of a photovoltaic roofing element of the first course. This configuration is shown in partial cross-sectional view in FIG. 3, along the line extending from the arrow marked "A". The photovoltaic roofing system can also include an inactive roofing element 150 (such as a conventional shingle or tile) disposed adjacent the first side edge of the second course, and on top of the second horizontal portion of the inside corner flashing element. This inactive roofing element is omitted from FIG. 2 for the sake of clarity, but appears in FIG. 3.

Figure 3:
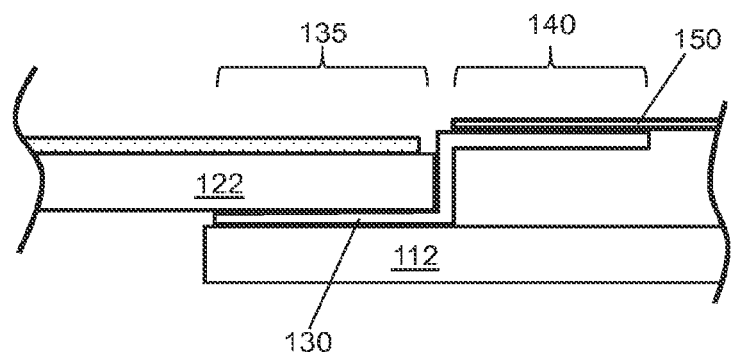
FIG. 3 is a partial schematic cross-sectional view of the photovoltaic roofing system of FIG. 2.

In certain embodiments, the second horizontal portion of the inside corner flashing element forms a cavity over the top edge of the photovoltaic roofing element of the first course, the cavity having a thickness in the range of about 1 cm to about 15 cm (e.g., about 1 cm to about 10 cm). In the example of FIG. 3, the second horizontal portion 140 of the inside corner flashing element is positioned above the photovoltaic roofing element 112 of the first course, forming the cavity. The cavity can be useful, for example, as a place to make electrical connections and/or route electrical cables. The second horizontal portion can, for example, be configured to form a cavity together with top flashings that (as described in U.S. patent application Ser. Nos. 13/326,081, 13/326,094 and 61/559,614). The second horizontal portion can, for example, be disposed in an overlapping fashion with an adjacent top flashing.

In other embodiments, the second horizontal portion of the inside corner is disposed at a level in the range of about 1 cm to about 15 cm (e.g., about 1 cm to about 10 cm) higher (i.e., farther away from the roof surface) than the horizontally-extending flange of the first horizontal portion, at least at its bottom edge. In some embodiments, the height of the second horizontal portion is tapered from its bottom edge toward its top edge.

The inside corner flashing elements described herein can be formed from a variety of materials in a variety of ways. For example, the inside corner flashing element can be formed as a unitary piece, for example, from molded plastic or from bent sheet metal. For example, the inside corner flashing element can have at least one region that is folded up or down with respect to its horizontally-extending regions. In other embodiments, the inside corner flashing element can be formed from a plurality of pieces, interlocking and/or affixed to one another. Multi-piece inside corner flashing elements can be formed from molded plastic or bent sheet metal. Welding, brazing or adhesive can be used to affix parts to one another, or to affix various folded parts of a single piece to each other to ensure shape stability.

Mechanical fasteners can also or alternatively be used. In other embodiments, the inside corner flashing element is formed from a bituminous material including one or more rigid supports to provide the desired surface profile. Similarly, the inside corner flashing element can be formed from a reinforced polymer material, molded to provide the desired shape(s). In certain embodiments, the horizontally-extending flange of the first horizontal portion is formed with a hemmed return. The person of skill in the art will appreciate that the inside corner flashing elements can be made from other materials and methods than those specifically described herein.

The surface of the inside corner flashing element can be formed in a variety of manners. For example, in one embodiment, the surface of the inside corner flashing is smooth, for example, painted or powder coated. In other embodiments, the surface of the inside corner flashing is metallic in appearance, for example, copper or aluminum in appearance; the metal can be polished or surface coated to retain the natural luster, or in some embodiments can be allowed to weather (or even provided in pre-weathered form). In certain embodiments, the surface is galvanized. In other embodiments, the surface of the inside corner flashing is textured, for example, with particulate material (e.g., mineral, polymer), fine or coarse in size. The surface can be provided with a protective polymer coating or protective film. The color of the surface of the inside corner flashing element can, for example, complement the roof color (e.g., of inactive roofing elements disposed thereon), the photovoltaic media of the photovoltaic roofing element, and/or a frame or substrate portion of the photovoltaic roofing element.

In certain embodiments, the inside corner flashing element is formed from a conductive material, and includes a structure for attachment of a grounding wire. For example, the inside corner flashing element can include a hole, a bolt, a nut, a rivet, a post, a screw or a clip configured to connect to a grounding wire. The grounding wire can in turn help to ground the photovoltaic roofing system, as may be required under local electrical codes.

Various aspects of the present invention can be used in conjunction with a wide variety of inactive roofing elements. For example, in certain embodiments, the inactive roofing elements are shingles, shakes or slates. In other embodiments, the inactive roofing elements are tiles. In one particular embodiment, the roofing elements are bituminous shingles, such as those available from CertainTeed Corporation.

Figure 4:
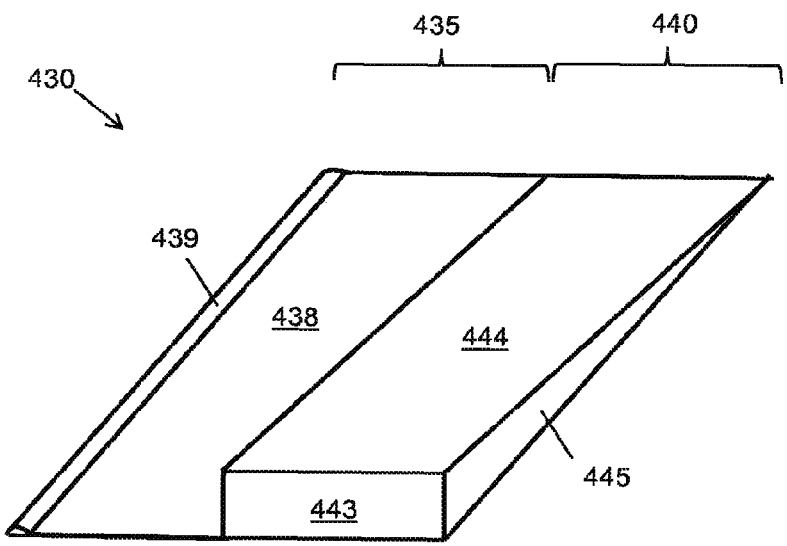
FIG. 4 is a schematic perspective view of an inside corner flashing element suitable for use in one embodiment of the invention.

One embodiment of an inside corner flashing element is shown in perspective schematic view in FIG. 4. Inside corner flashing element 430 includes first horizontal portion 435 and second horizontal portion 440. The first horizontal portion includes a horizontally-extending flange 438, which includes a hemmed return 439. The second horizontal portion 440 has a vertical wall 443 at its bottom edge, and has a top surface 444 that extends from its bottom edge to its top edge. Here, the top surface of the second horizontal portion of the inside corner flashing element is disposed at a level in the range of about 1 cm to about 15 cm higher than the horizontally-extending flange of the first horizontal portion at its bottom edge. Also, the second horizontal portion of the inside corner flashing element forms a cavity over the top edge of the photovoltaic roofing element of the first course, the cavity having a thickness in the range of about 1 cm to about 15 cm. In this embodiment, there is also a vertical wall 445 at the second side edge of the second horizontal portion; in other embodiments, there is no such wall such that the cavity underneath the second horizontal portion can join a cavity formed by other top flashing elements. In the embodiment of FIG. 4, the inside corner flashing element can be made from, for example, sheet metal, cut and folded and optionally sealed (e.g., by welding, brazing or gluing) to provide the desired shape.

In the embodiment of FIG. 4, the height of the second horizontal portion of the inside corner flashing element is tapered from its bottom edge toward its top edge. In the embodiment of FIG. 4, the taper is shown as being continuous from the bottom edge to the top edge of the second horizontal portion. In other embodiments, the taper runs only partially along the second horizontal portion, for example from the bottom edge but not all the way to the top edge (i.e., to a point removed from the top edge, see inside corner flashing element 530 of FIG. 5), from a point removed from the bottom edge all the way to the top edge (see inside corner flashing element 531 of FIG. 5), or from a point removed from the bottom edge to a point removed from the top edge.

Figure 5:
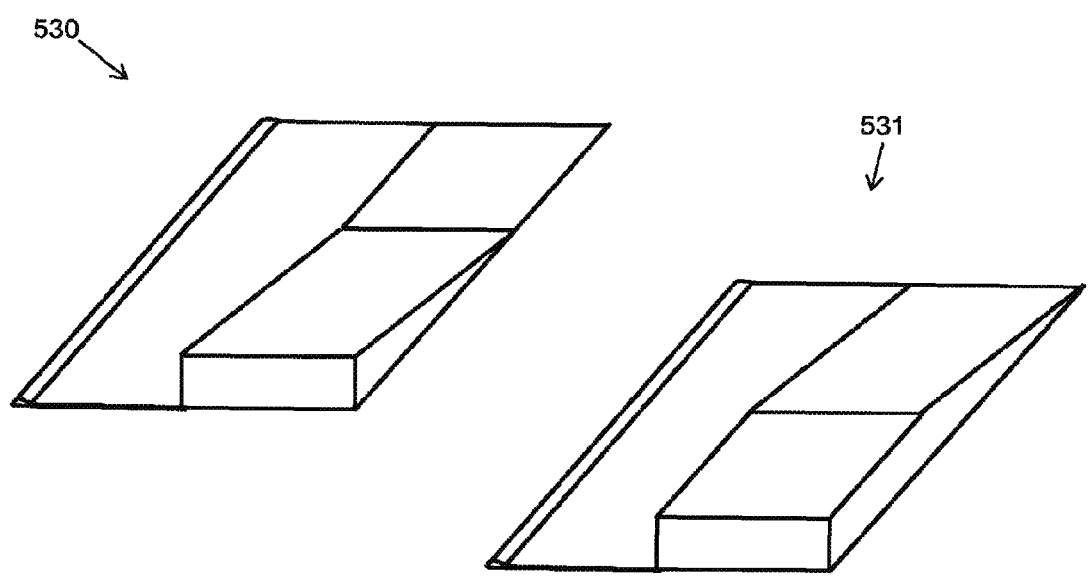
FIG. 5 is a pair of schematic perspective views of inside corner flashing elements suitable for use in other embodiments of the invention.
Figure 6:
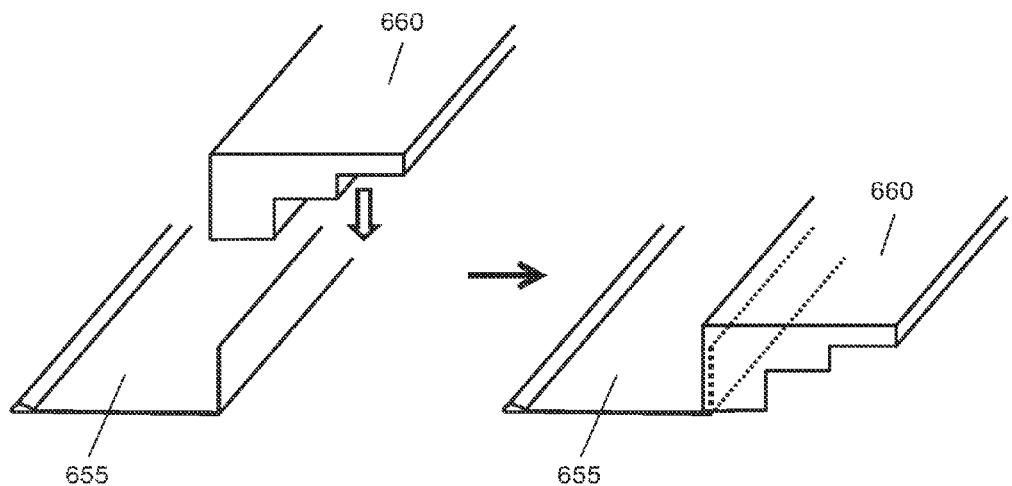
FIGS. 6 and 7 each provide partial exploded and assembled schematic perspective views of an inside corner flashing element suitable for use in other embodiments of the invention.
Figure 7:
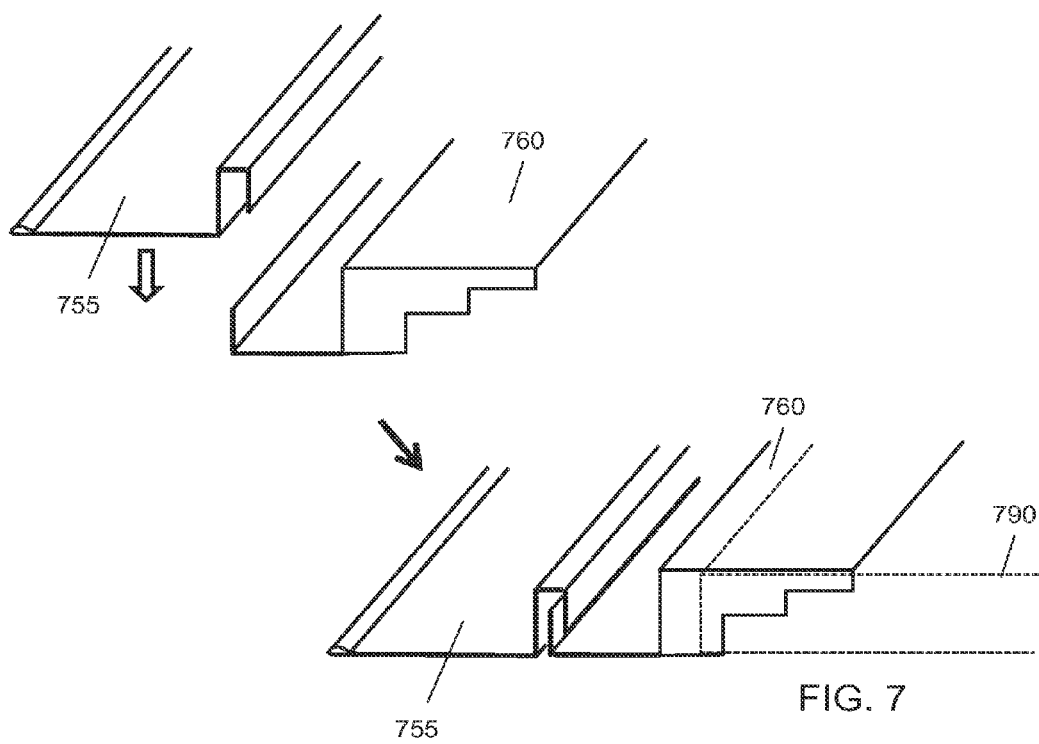
Figure 8:
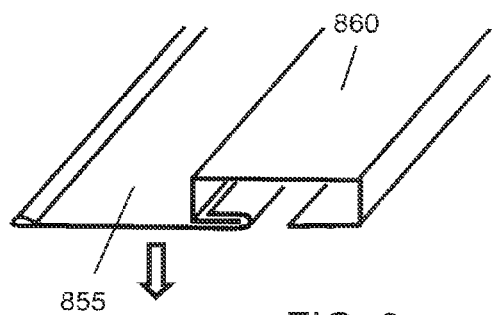
FIGS. 8 and 9 each provide a partial assembled schematic perspective view of an inside corner flashing element suitable for use in other embodiments of the invention.
Figure 9:
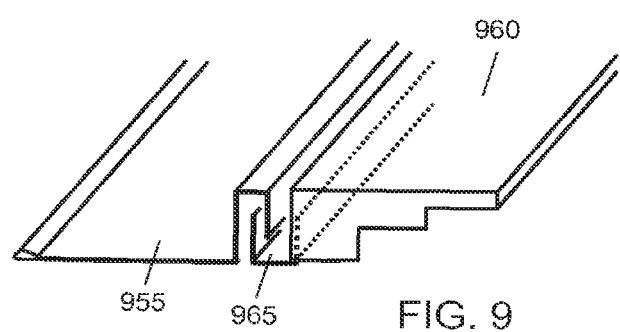

In the embodiments of FIGS. 4 and 5, each inside corner flashing element is formed as a unitary piece. In other embodiments, the inside corner flashing element is formed from a plurality of pieces. FIGS. 6-9 are partial schematic views of a variety of inside corner flashing elements formed from a plurality of pieces. In the embodiment of FIG. 6, the piece 660 fits over the upwardly-directed flange on piece 655 to form a water-tight joint. In the embodiment of FIG. 7, the downwardly-facing channel of piece 755 fits over the upwardly-directed flange on piece 760, similarly forming a water-tight joint. Further, in the embodiment of FIG. 7, the second horizontal portion does not have a sidewall at its lateral edge distal from the first horizontal portion. Thus, the second horizontal portion can overlap an adjacent flashing (shown in dotted line and indicated by reference number 790 in the as-assembled part of the drawing). In embodiments in which a sidewall is present, an adjacent flashing can overlap the second horizontal portion. In the embodiment of FIG. 8, the piece 860 has two folded-over flanges, one of which is disposed in a folded over portion of piece 855. In the embodiment of FIG. 9, three pieces are assembled to form the inside corner flashing element; piece 965 has two upwardly-directed flanges, one of which fits into piece 960 (as described above with reference to FIG. 6), and the other of which fits into a downwardly-facing channel of piece 955 (as described above with reference to FIG. 7). In some embodiments, the various pieces can be disposed on the roof together but not affixed to one another, such that the pieces can move relative to one another to allow for thermal expansion and contraction. In other embodiments, various pieces can be affixed to one another or otherwise held together, for example, with an adhesive, a fastener such as a screw or a rivet, or by being crimped together. In the embodiments of FIGS. 7 and 9, the central portion of the inside corner flashing element (i.e., in the region where the various pieces are joined) is formed as a channel, which can convey collected water down the roof and onto lower courses of roofing materials.

Figure 10:
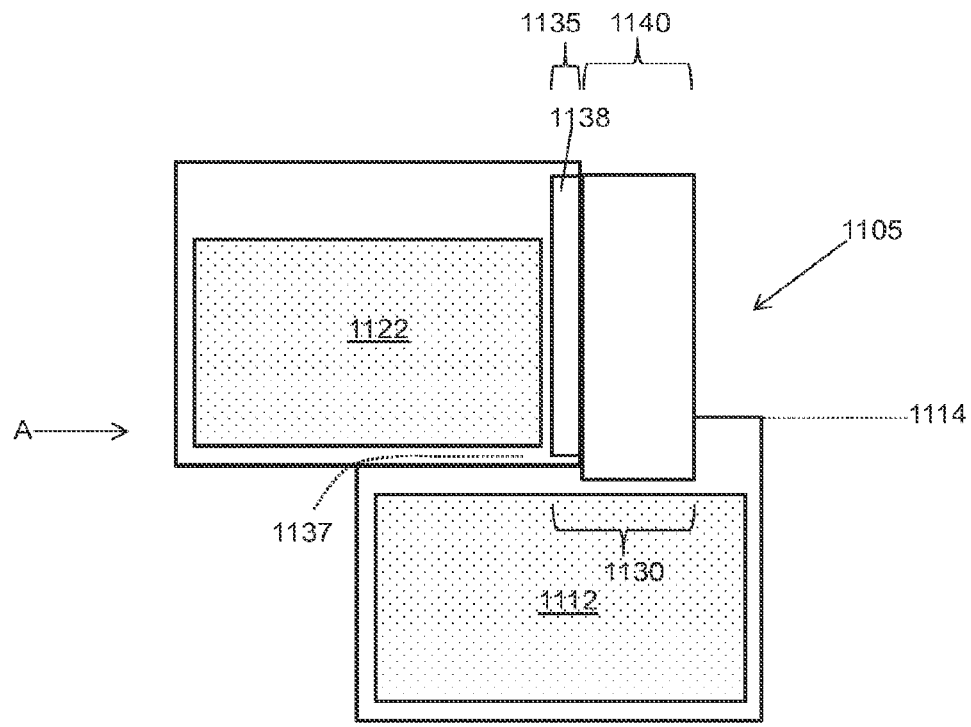
FIG. 10 is a partial schematic plan view.
Figure 11:
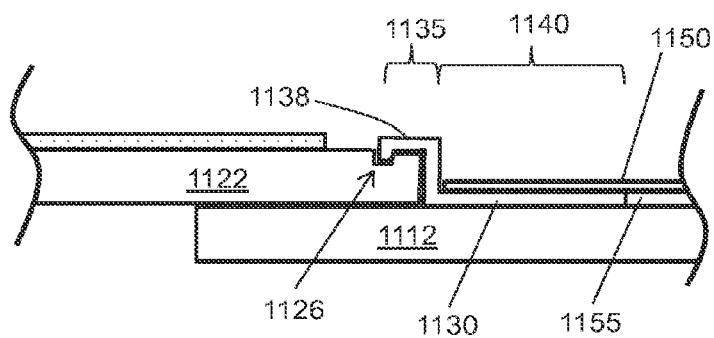
FIG. 11 is a partial schematic cross-sectional view of a photovoltaic roofing system according to one embodiment of the invention.

Another embodiment is shown in partial schematic view in FIG. 10, and in partial cross-sectional schematic view (along the arrow marked "A") in FIG. 11. In this embodiment, the first and second courses of the photovoltaic roofing system are substantially as described in FIG. 1; the view of FIGS. 10 and 11 focus on the region of the inside corner, with an endmost photovoltaic roofing element of each of the first and second courses (1112 and 1122, respectively). In the photovoltaic roofing system of FIGS. 10 and 11, an inside corner flashing element 1130 is disposed in the inside corner 1105. The inside corner flashing element has a first horizontal portion 1135 and a second horizontal portion 1140 horizontally adjacent the first horizontal portion. The first horizontal portion 1135 includes a horizontally-extending flange 1138 that forms a water-resistant interface with the photovoltaic roofing element at the first side edge of the second course. In this embodiment, horizontally-extending flange 1138 is disposed over the photovoltaic roofing element 1122 at the first side edge of the second course, and overlaps the top edge 1114 of the a photovoltaic roofing element of the first course. In this embodiment, the horizontally-extending flange 1138 includes a feature that interacts with a corresponding feature of the photovoltaic roofing element 1122 of the second course (here, a downwardly facing flange that is disposed in an upwardly-facing channel on the surface of the photovoltaic roofing element). The second horizontal portion 1140 overlaps the top edge 1114 of a photovoltaic roofing element of the first course. The photovoltaic roofing system can also include an inactive roofing element 1150 (such as a conventional shingle or tile) disposed adjacent the first side edge of the second course, and on top of the second horizontal portion of the inside corner flashing element. This inactive roofing element is omitted from FIG. 10 for the sake of clarity, but appears in FIG. 11. In the embodiment of FIG. 11, a top flashing 1155 is disposed adjacent the inside corner flashing; the inactive roofing element is disposed over both the second horizontal portion of the inside corner flashing element and the top flashing.

Figure 12:
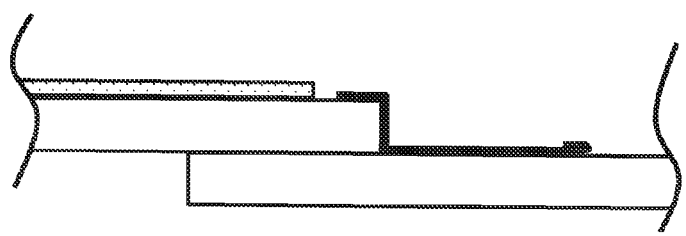
FIG. 12 is a partial schematic cross-sectional view of a photovoltaic roofing system according to another embodiment of the invention.

Of course, in other embodiments, the first horizontal portion has no feature that interlocks or otherwise interacts with a feature on the photovoltaic roofing element of the second course. Such an embodiment is shown in partial cross-sectional schematic view in FIG. 12. In the embodiment of FIG. 12, the second horizontal portion is formed with a hemmed return as described above. The person of skill in the art will appreciate that a hemmed return can be used on any horizontally-terminated surface.

Figure 13:
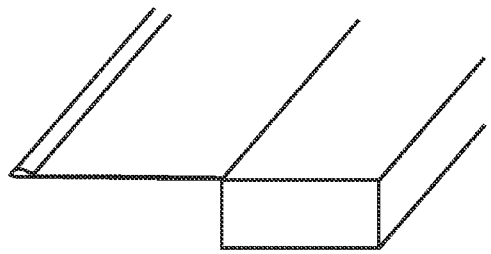
FIGS. 13-16 each provide a partial assembled schematic perspective view of an inside corner flashing element suitable for use in other embodiments of the invention.
Figure 14:
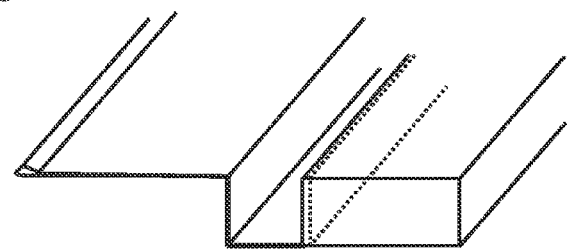
Figure 15:
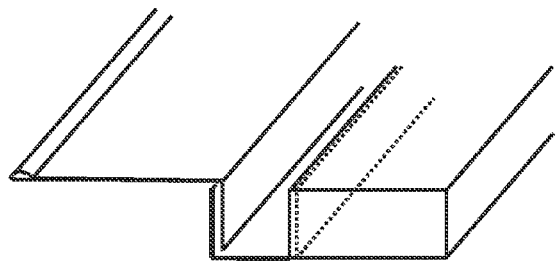
Figure 16:
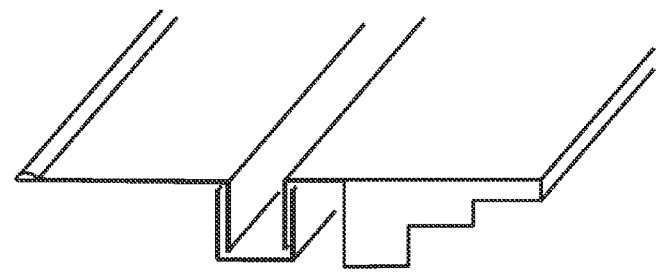

In the embodiment of FIGS. 10-11 (and the embodiment of FIG. 12), the second horizontal portion is disposed directly on the photovoltaic roofing element 1112 of the first course. In other embodiments, the second horizontal portion can form a cavity or be removed from the surface of the photovoltaic roofing element of the first course, as described above with respect to the embodiments of FIGS. 2 and 3. Examples of such inside corner flashing elements are shown in schematic perspective view in FIGS. 13-16. The embodiment of FIG. 13 is formed as a unitary piece, while FIGS. 14-16 are formed from multiple pieces. In the embodiments of FIGS. 14-16, the central portion of the inside corner flashing element (i.e., in the region where the various pieces are joined) is formed as a channel, which can convey collected water down the roof and onto lower courses of roofing materials.

Figure 17:
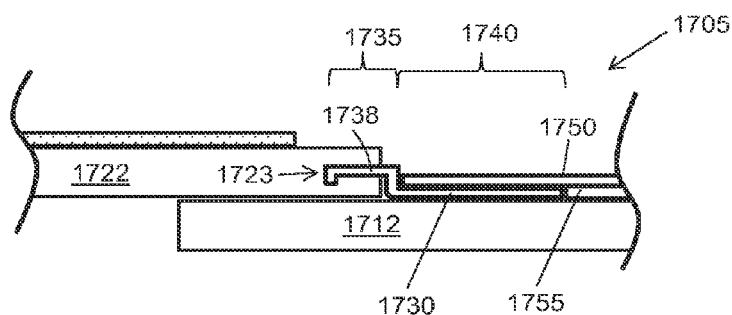
FIG. 17 is a partial schematic cross-sectional view of a photovoltaic roofing system according to one embodiment of the invention.
Figure 18:
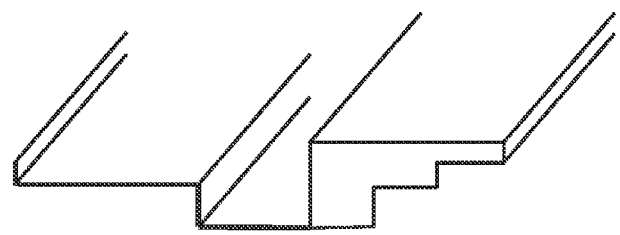
FIGS. 18 and 19 each provide a partial schematic perspective view of an inside corner flashing element suitable for use in other embodiments of the invention.
Figure 19:
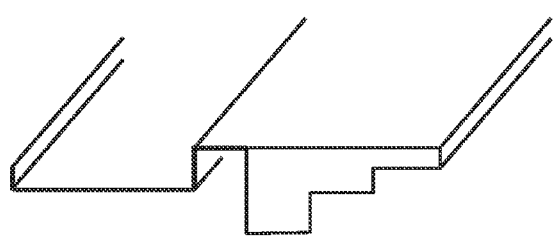

Another embodiment is shown in partial cross-sectional schematic view in FIG. 17. In this embodiment, the first and second courses of the photovoltaic roofing system are substantially as described in FIG. 1; the view of FIG. 17 focuses on the region of the inside corner, with an endmost photovoltaic roofing element of each of the first and second courses (1712 and 1722, respectively). In the photovoltaic roofing system of FIG. 17, an inside corner flashing element 1730 is disposed in the inside corner 1705. The inside corner flashing element has a first horizontal portion 1735 and a second horizontal portion 1740 horizontally adjacent the first horizontal portion. The first horizontal portion 1735 includes a horizontally-extending flange 1738 that forms a water-resistant interface with the photovoltaic roofing element at the first side edge of the second course. In this embodiment, the horizontally-extending flange 1738 is disposed in a channel 1723 formed in the photovoltaic roofing element 1722 at the first side edge of the second course (i.e., in this embodiment, in its first side edge), and overlaps the top edge of the a photovoltaic roofing element of the first course (i.e., such that its bottom edge is down-roof from the top edge of the photovoltaic roofing element). Thus, a tongue-in-groove connection or interlock can be made between the In this embodiment, the horizontally-extending flange 1738 includes a feature that interacts with a corresponding feature of the photovoltaic roofing element 1722 of the second course (here, a downwardly facing flange that can prevent the horizontally-extending flange from pulling away from the photovoltaic roofing element). The second horizontal portion 1740 overlaps the top edge of a photovoltaic roofing element of the first course. The photovoltaic roofing system can also include an inactive roofing element 1750 (such as a conventional shingle or tile) disposed adjacent the first side edge of the second course, and on top of the second horizontal portion of the inside corner flashing element. In the embodiment of FIG. 17, a top flashing 1755 is disposed adjacent the inside corner flashing; the inactive roofing element is disposed over both the second horizontal portion of the inside corner flashing element and the top flashing. Additional examples of inside corner flashing elements suitable for use in embodiments in which the horizontally-extending flange is disposed in a channel formed in the photovoltaic roofing element of the second course are shown in partial schematic perspective views in FIGS. 18 and 19. In these embodiments, the horizontally-extending flange is terminated in an upwardly facing flange, which can prevent the horizontally-extending flange from pulling away from the photovoltaic roofing element and can retain water on top of horizontally-extending flange to be carried down the roof.

Figure 20A:
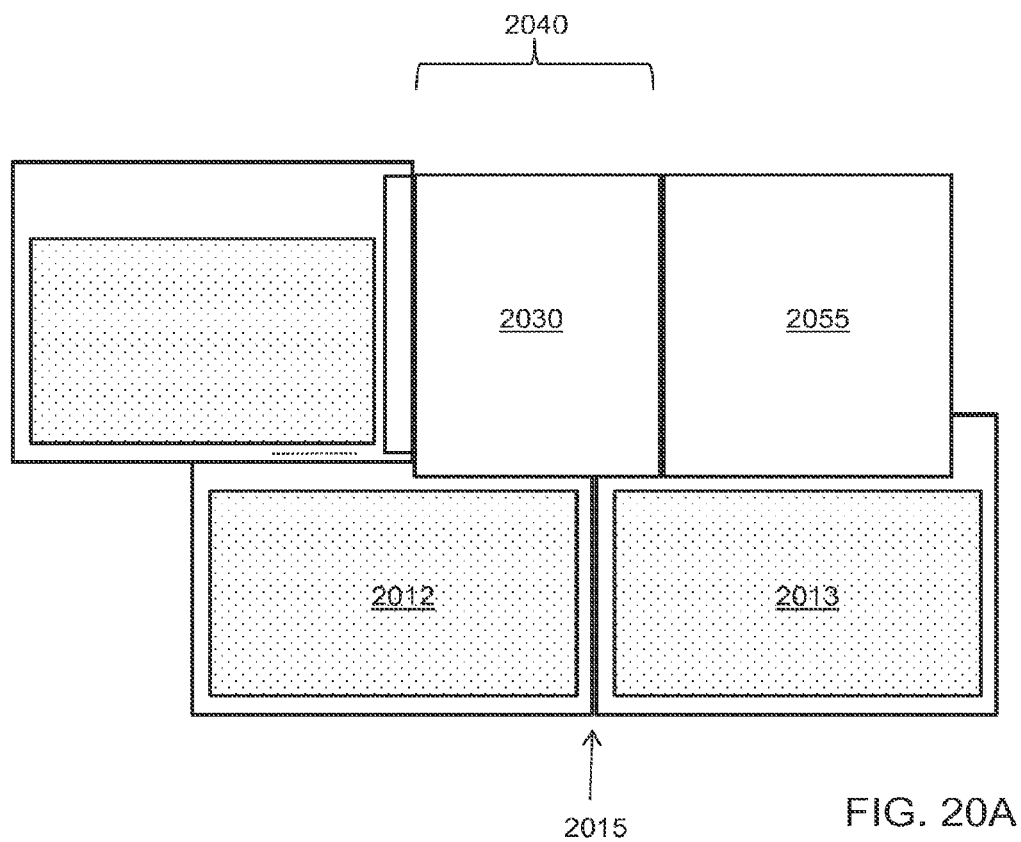
FIG. 20A is a partial schematic plan view.
Figure 20B:
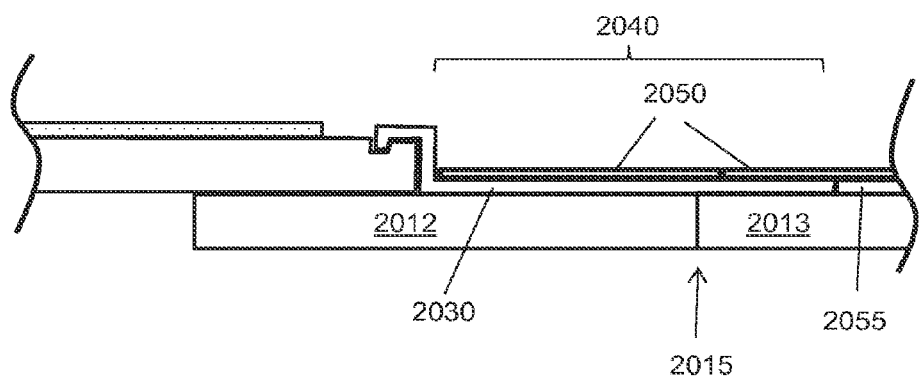
FIG. 20B is a partial schematic cross-sectional view of a photovoltaic roofing system according to one embodiment of the invention.

In certain embodiments of the photovoltaic roofing systems as described herein, the second horizontal portion of the inside corner flashing element is disposed over a horizontal joint between two adjacent photovoltaic roofing elements of the first course. For example, in the embodiment shown in schematic plan view in FIG. 20A, and in schematic partial cross-sectional view in FIG. 20B, two adjacent photovoltaic roofing elements of the first course (2012, 2013) have a horizontal joint 2015 between them. The second horizontal portion 2040 of the inside corner flashing element 2030 is disposed over the horizontal joint 2015. In certain embodiments, and as shown in FIGS. 20A and 20B, a top flashing 2055 is included adjacent to (possibly in an overlapping fashion) the inside corner flashing element. As shown in FIG. 20B, one or more inactive roofing elements 2050 can be disposed on the second horizontal portion of the inside corner flashing element.

In certain embodiments, each photovoltaic roofing element includes a frame structure having an upward-facing surface and a downward-facing surface. The frame structure includes an attachment zone and an exposure zone, with the exposure zone disposed toward the bottom end of the frame structure, and the attachment zone disposed toward the top end of the frame structure. The photovoltaic roofing element further includes one or more photovoltaic elements held in the frame structure. Such photovoltaic roofing elements, and flashings for use therewith, are described in detail in U.S. patent application Ser. Nos. 13/326,081, 13/326,094 and 61/559,614, each of which is hereby incorporated herein by reference in its entirety.

In certain embodiments, the frame structure includes sidelap portions disposed at its lateral edges and having geometries adapted to interlock with adjacent photovoltaic roofing elements to provide water drainage channels. For example, in one embodiment, the sidelap portion at one lateral edge has an upward-facing water drainage channel; and the sidelap portion at the other lateral edge has a downward-facing flange that fits into the water drainage channel of an adjacent (e.g., identical) photovoltaic roofing element. This configuration is preferred, as it allows a single type of photovoltaic roofing element to be used in an installation. Of course in other embodiments, a single photovoltaic roofing element can have two upward-facing water drainage channels or two downward-facing flanges in its sidelap portions; as long as such photovoltaic roofing elements are properly mated with the corresponding features on adjacent photovoltaic roofing elements, they can be used to construct a water-tight photovoltaic roofing system.

In certain embodiments, the first horizontal portion of the inside corner flashing element has a geometry that interlocks with the photovoltaic roofing element at the first side edge of the second course to provide a water drainage channel. For example, as shown in FIG. 11, the first horizontal portion 1135 of the inside corner flashing element 1130 has a feature that interlocks with the photovoltaic roofing element 1122 to provide a drainage channel 1126.

When installed, any water that moves over the lateral edges of the photovoltaic roofing element will be delivered into the water drainage channel, where it can be delivered down the roof. In certain embodiments, the water drainage channel is open at the bottom edge of the frame structure, such that water can flow out of it and down over the next course of photovoltaic roofing elements.

In certain embodiments, the frame structure includes sidewalls that at least partially define the area in which the one or more photovoltaic elements are held. The sidewalls desirably form a substantially closed polygon, e.g., a rectangle formed by sidewalls on all four sides. The sidewalls, e.g., those on the top sidewall and/or the bottom sidewall, can include drainage channels (formed for example as small discontinuities in the sidewalls) to allow water to drain down the roof. In certain embodiments, the sidewalls substantially enclose the area in which the one or more photovoltaic elements are held; and the one or more photovoltaic elements substantially fill the area defined by the sidewalls. For example, the one or more photovoltaic elements and/or a transparent cover element covering the photovoltaic elements desirably fit within 3 mm, within 2 mm, or even within 1 mm of the sidewalls. The sidewalls are desirably in the range of 2 mm-1 cm in height. In certain embodiments, one or more of the sidewalls do not extend beyond the height of the photovoltaic elements (i.e., in the plane of the one or more photovoltaic elements).

Figure 21:
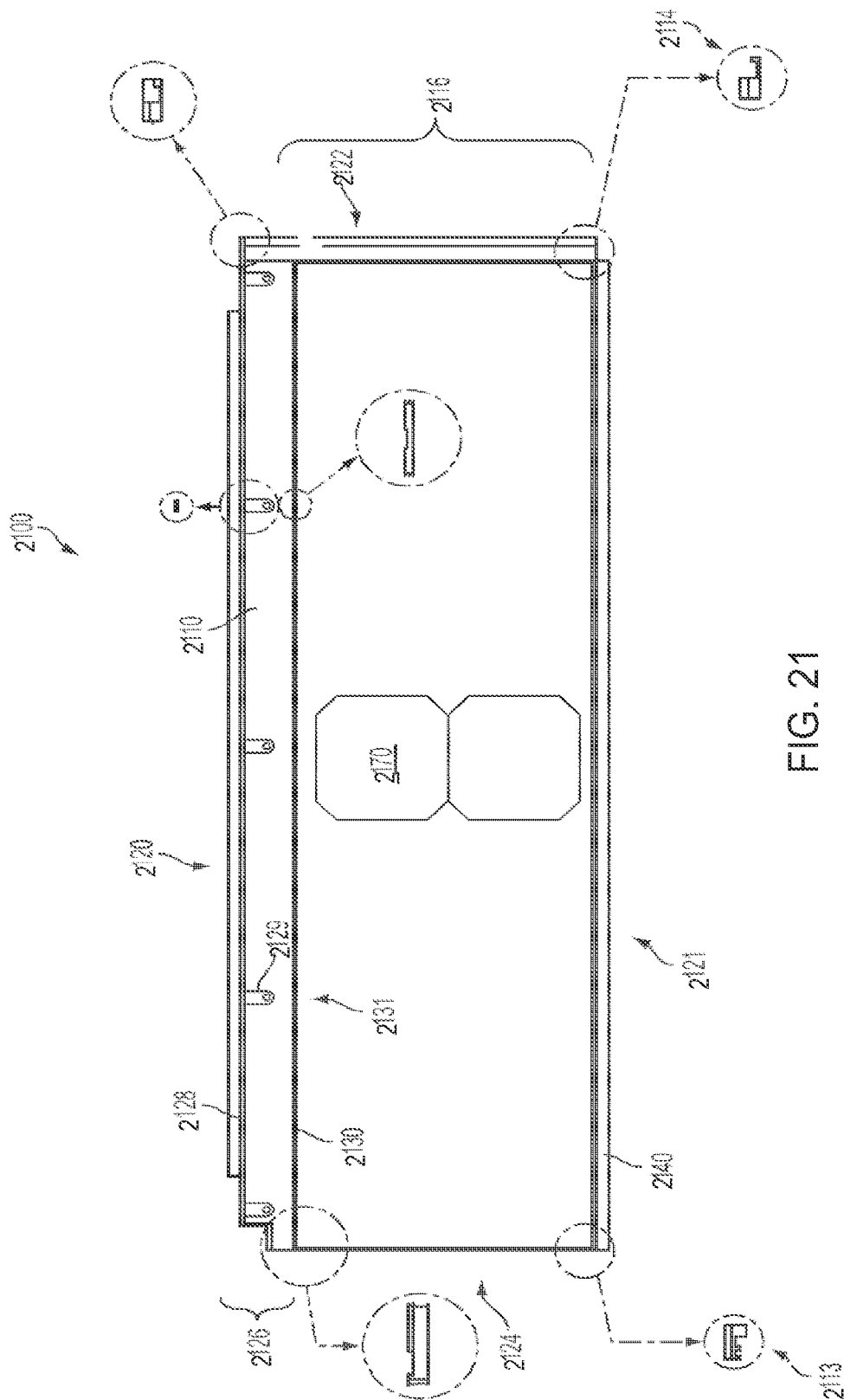
FIG. 21 provides a top view and various partial cross-sectional views of a photovoltaic roofing element suitable for use in certain embodiments of the invention.

One embodiment of the invention is shown in top view and in various partial cross-sectional views in FIG. 21. The photovoltaic roofing element 2100 of FIG. 21 includes a frame structure 2110 having an upward-facing surface and a downward-facing surface. When the photovoltaic roofing element is installed on a roof, the downward-facing surface generally faces the roof surface, while the upward-facing surface generally toward the sky.

More specifically, in certain embodiments, and in the embodiment of FIG. 21, the frame structure has a sidelap feature 2113 at its left side, and a shiplap feature 2114 at its right side, equipped with water dams and drainage paths to minimize water intrusion into the roof. The shiplap feature 2114 includes a water drainage channel; and sidelap feature 2113 includes a downward-facing flange that is configured to fit in the water drainage channel of the shiplap feature of an adjacent photovoltaic roofing element. As will be described in more detail hereinbelow, such photovoltaic roofing elements can be installed on a roof using flashing having coordinating dam and drainage structures. Photovoltaic roofing elements of this type are described in more detail in U.S. patent application Ser. Nos. 13/326,094 and 13/326,081, each of which is hereby incorporated herein by reference in its entirety.

In the embodiment of FIG. 21, the exposure area 2116 of the frame structure is equipped with two rows of seven photovoltaic elements 2170, each about 5"×5" in dimension. For the sake of clarity, and in order to show the details of the frame structure, only two such photovoltaic elements are shown. The frame structure has a top edge 2120, a bottom edge 2121, a right edge 2122 and a left edge 2124. When installed on a roof deck, the top edge is disposed toward the ridge side of the roof deck (i.e., toward its top end), and the bottom edge is disposed toward the eave side of the roof deck (i.e. toward its bottom end). In the embodiment of FIG. 21, near the top end is an attachment zone 2126 for fastening the photovoltaic roofing element to a roof structure. A raised lip 2128 is provided at the top end of the attachment zone as a dam against water, in order to help prevent moisture intrusion over the upper edge of the photovoltaic roofing element and help to close the roof to the environment. Mounting tabs 2129 are provided at several locations across the width of the attachment zone with raised nail bosses, the raised structure providing additional protection from water intrusion through the nail holes. Near the bottom end of the attachment zone is a top sidewall 2130, delineating the top edge of the area in which the one or more photovoltaic elements are disposed. Spaced along this top sidewall are drainage openings (e.g., slots or weep holes) 2131, such that any water in the attachment zone can drain down the roof over the exposure area 2116 of the photovoltaic roofing element.

Figure 21A:
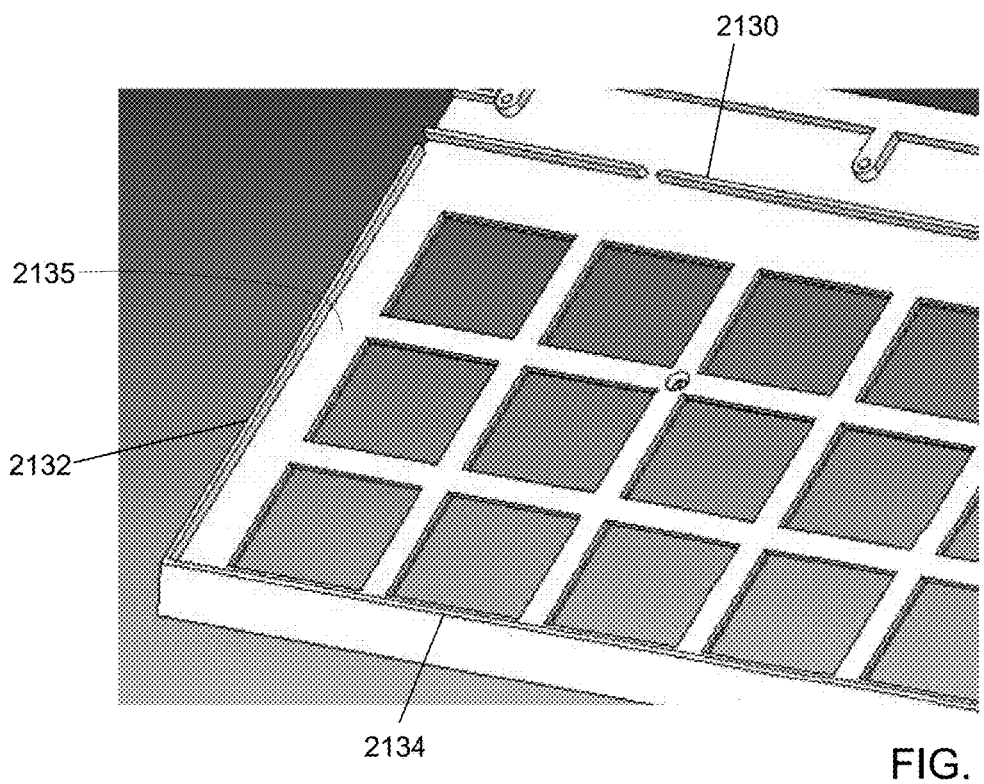
FIG. 21A provides a partial perspective view of a frame structure suitable for use in certain embodiments of the invention.

A top perspective view of a similar frame structure is shown in FIG. 21A. The frame structure of FIG. 21A includes top sidewall 2130, as well as sidewalls 2132 and 2134, defining the left, and bottom edges of the area in which the one or more photovoltaic elements are disposed. In certain embodiments, a similar sidewall is provided at the right edge of the area in which the one or more photovoltaic elements are disposed (i.e. internally adjacent the shiplap feature as described above with respect to FIG. 21). The frame structure is otherwise similar to that described above with respect to FIG. 21. In other embodiments, no sidewall is provided at the right edge; the left-edge sidewall of an adjacent frame structure provides the fourth sidewall defining the area in which the one or more photovoltaic elements are disposed. In certain embodiments, the sidewalls extend above the upward-facing surface 2135 of the area in which the one or more photovoltaic elements are disposed by at least about 1 mm, at least about 2 mm, or even by at least about 3 mm. In certain embodiments, however, the sidewalls extend above the upward-facing surface 2135 of the area in which the one or more photovoltaic elements are disposed by no more than about 15 mm, no more than about 10 mm, or even by no more than about 8 mm.

Figure 22:
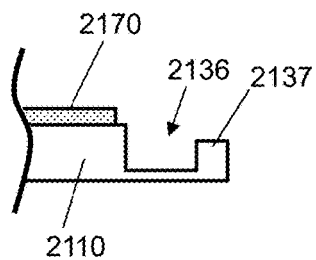
FIGS. 22 and 23 provide cross-sectional schematic views of left- and right-edges of a photovoltaic roofing element suitable for use in certain embodiments of the invention.
Figure 23:
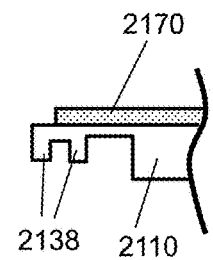

The photovoltaic roofing elements of FIGS. 21 and 21A can be arranged in an array, with laterally adjacent photovoltaic roofing elements being engaged with one another in a shiplap manner. The photovoltaic roofing element has on one side edge (in FIG. 21, the right-hand edge) an upward-facing water drainage channel. FIG. 22 is a cross-sectional view of the photovoltaic roofing element of FIG. 21 in its exposure zone at its right hand edge, in which the frame structure 2110, photovoltaic element 2170, and upward-facing channel 2136 is visible. An outer flange 2137 defines the upward-facing water drainage channel. The upward-facing water drainage channel is preferably open at the bottom edge of the photovoltaic roofing element, such that any water entering the gap between adjacent photovoltaic roofing elements is collected therein and conducted down the roof. As shown in FIG. 22, the upward-facing channel is at a lower elevation with respect to the attachment zone. The photovoltaic roofing element has on its opposite side edge (in FIG. 21, the left-hand edge) a downward-facing flange (e.g., a ridge), configured such that the downward-facing flange of one photovoltaic roofing element can engage the upward-facing channel of an adjacent photovoltaic roofing element. FIG. 23 is a cross-sectional view of the photovoltaic roofing element of FIG. 21 in its exposure zone at its left-hand edge, in which two downward-facing flanges 2138 are visible. These downward-facing flanges are configured to fit in the upward-facing water drainage channel of an adjacent photovoltaic roofing element.

The person of skill in the art will appreciate that the inside corner flashing elements can be configured such that the first horizontal portions thereof can engage the photovoltaic roofing element at the first end of the second course in a shiplap manner as described above with respect to FIGS. 22 and 23. Accordingly, in certain embodiments, the first horizontal portion of the inside corner flashing element can be formed as shown in FIG. 22, or as shown in FIG. 23.

In certain embodiments, and as shown at the lower edge of the photovoltaic roofing element of FIG. 21, a leading edge extension 2140 is provided to cover an upper portion of a photovoltaic roofing element of an underlying course of photovoltaic roofing elements. When installed in an array, the leading edge extension 2140 can extend substantially to the exposure zone of an underlying course of photovoltaic roofing elements, to improve conduction of water down the roof. In certain embodiments, the leading edge extension does not span the entire length of the frame structure; for example, as shown in FIG. 21, it can be missing in one of the sidelap portions, such that the leading edge extensions of adjacent photovoltaic roofing elements do not interfere with one another. In certain embodiments, the leading edge extension includes a recess on its downward-facing surface, to accommodate the raised lip 2128 at the top end of the attachment zone of an overlying photovoltaic roofing element, thereby forming part of the water barrier system between the panels. In use, the leading edge extension can be covered by the one or more photovoltaic elements; it need not be a visually distinct feature. Of course, in other embodiments, the sidelap and shiplap features can extend the entire height of the frame structure, so that the entire height of the side edges of adjacent elements interlock to one another.

Figure 24:
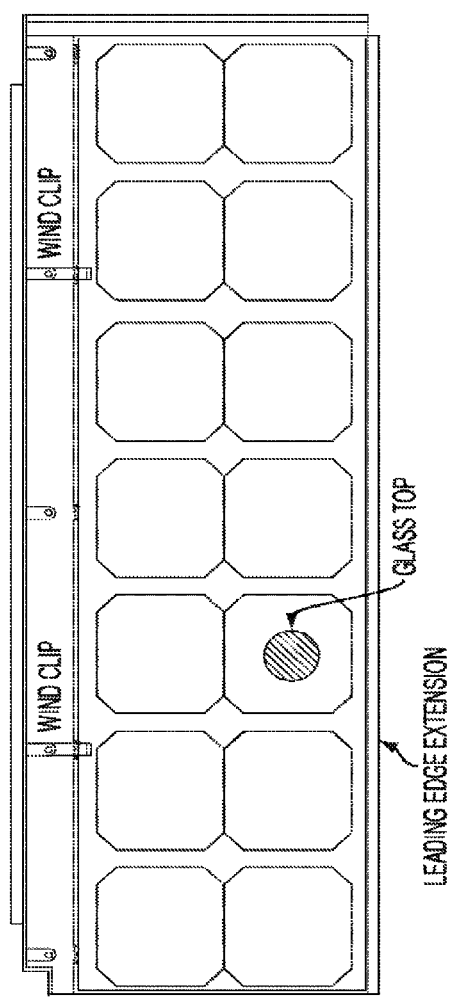
FIG. 24 is a schematic plan view of a photovoltaic roofing element suitable for use in certain embodiments of the invention.

FIG. 24 is another top schematic view of the photovoltaic roofing element of FIGS. 21 and 21A with a rigid photovoltaic element (e.g., a module including the two rows of seven photovoltaic cells as described above, with a tempered glass top cover to protect the cells). Cells are laterally spaced at intervals of about ¾ inch. The cells are inset from the top and bottom edges of the module by about ½ inch and from the left and right side edges by about ⅜ inch. Preferably, the cells of the module are inset from the edges of the module sufficiently to conform to UL, NEC or other electrical code requirements. The module is set into the panel in the area formed by the sidewalls and sealed in place with an appropriate sealant, e.g., as a perimeter ridge surrounding the module. The photovoltaic element (here, the module as defined by its tempered glass cover) will preferably be within 3 mm, within 2 mm, or even within 1 mm of the sidewalls. Preferably, the ridge running along the top edge of the module provides a raised lip at the lower edge of the attachment zone and has drainage openings as described above to provide drainage over the top surface of the module in the exposed area of the photovoltaic roofing element.

In FIG. 24, the bottom edge of the photovoltaic roofing element is formed by the leading edge extension, but as described above, in some embodiments, no leading edge extension is at the bottom edge of the photovoltaic roofing element. In either event, an indicator line is shown in FIG. 24 about ½ inch below the ridge at the bottom end of the attachment zone to suggest where the bottom edge of an overlying photovoltaic roofing element would lie in the installed condition. The bottom edge of the overlying photovoltaic roofing element preferably covers the horizontal-running seam where the photovoltaic element is disposed in the frame structure (i.e., along the top sidewall). Wind clips are shown to be attached using two of the nail boss fastening zones using the same fasteners to mount the panel to a roof structure; the wind clips can hold down the bottom edge of the overlying photovoltaic roofing element. In this embodiment, the drainage holes in the lower lip of the attachment zone are aligned with the nail bosses so that the wind clips pass through the drainage holes and provide an upward directed hook or clip to assist in securing an overlying course of photovoltaic roofing elements to the already installed lower course.

In certain embodiments, the lower edges of the first and second horizontal portions of the inside corner flashing element extend down the roof beyond the leading edge extension.

Figure 25:
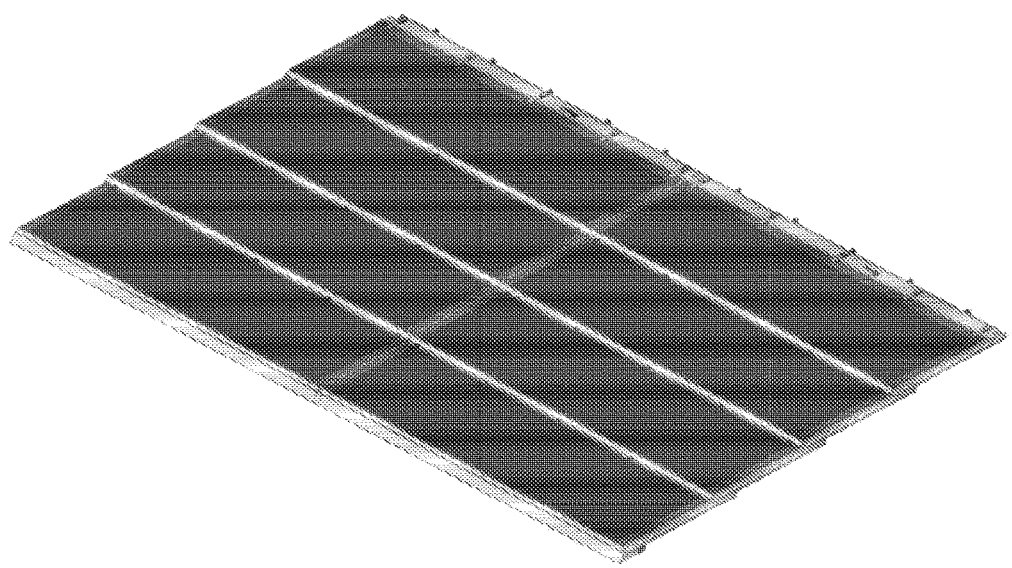
FIG. 25 is a schematic perspective view of an array of photovoltaic roofing elements.

FIG. 25 shows a small array of the photovoltaic roofing elements of FIG. 24. The array of FIG. 25 is two photovoltaic roofing elements wide and four photovoltaic roofing elements high. Side and top flashing (not shown) can be provided as described in U.S. patent application Ser. No. 13/326,094, to close the array at the sides and top and merge the photovoltaic array into a field of surrounding conventional shingles. The inside corner flashing element can overlap, interlock with, or otherwise be configured to close the array in conjunction with the other flashings.

Figure 26:
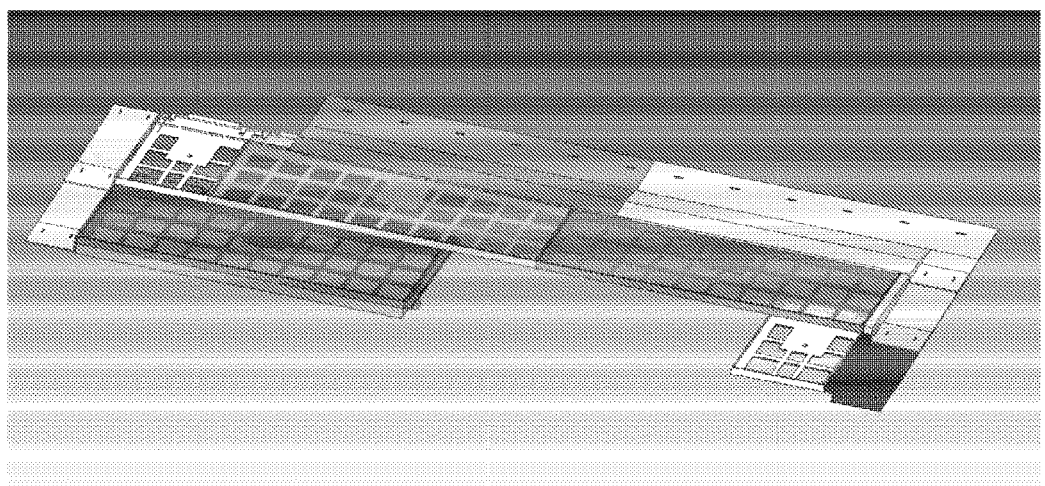
FIG. 26 is a schematic perspective view of an array of frame structures assembled together with side and top flashings.

Certain aspects of the invention relate to the fashion in which flashing elements are provided to close the transition that merges a photovoltaic array made up of photovoltaic roofing elements into the field of conventional roofing products used in conjunction with the photovoltaic roofing elements. Flashing elements as installed together with a small array of photovoltaic roofing elements (frame structures shown) are shown in perspective view in FIG. 26. The view of FIG. 26 does not show an inside corner, but does show examples of flashing of the top and sides of an array.

Accordingly, in certain embodiments the photovoltaic roofing system includes one or more photovoltaic roofing elements contiguously disposed on the roof deck, the contiguously-disposed roofing elements together having a top edge facing the top end of the roof deck, a bottom edge facing the bottom end of the roof deck, and two side edges. Each photovoltaic roofing element comprises one or more photovoltaic elements disposed on a frame structure. The frame structure includes sidelap portions having geometries adapted to interlock with adjacent photovoltaic roofing elements to provide water drainage channels. The photovoltaic roofing system also includes a plurality of roofing elements disposed adjacent the contiguously-disposed photovoltaic roofing elements, along their side edges. The photovoltaic roofing system further comprises side flashing elements disposed along the side edges of the contiguously-disposed photovoltaic roofing elements, the side flashing elements having a cross-sectional shape comprising a vertically-extending feature and a flange extending away from a lateral side at the downward end of the vertically-extending feature, with the flange facing away from the contiguously-disposed photovoltaic roofing elements and being at least partially disposed between a roofing element and the roof deck. The vertically-extending feature includes a matched interlocking geometry adapted to interlock with the sidelap portion of an adjacent photovoltaic roofing element. For example, in certain embodiments, the vertically-extending features of the side flashing elements along a first lateral edge of the contiguously-disposed photovoltaic roofing elements include a downward-facing flange, disposed in upward-facing channels of the photovoltaic roofing elements disposed along the first lateral edge; and wherein the vertically-extending features of the side flashing elements along a second lateral edge of the contiguously-disposed photovoltaic roofing elements include an upward-facing water drainage channel, into which downward-facing flanges of the photovoltaic roofing elements disposed along the second lateral edge are disposed.

A top flashing and/or a bottom flashing can also be included to merge the photovoltaic roofing system with a field of conventional roofing products and close the transition areas therebetween to the elements. Accordingly, in certain embodiments, one or more top flashing elements is or are disposed along the top edge of the contiguously-disposed photovoltaic roofing elements, the one or more top flashing elements having a bottom end disposed over the top edge of the contiguously-disposed photovoltaic roofing elements; and a top end disposed under one or more roofing elements disposed along the top edge of the contiguously-disposed photovoltaic roofing elements.

FIGS. 27, 28 and 29 show top schematic views and edge schematic views of examples of top flashing elements for closing the top portion of the array of photovoltaic roofing elements according to one embodiment of the invention. In these figures, the top plan views depict the leftmost side of a given flashing section near the top of the drawing and the rightmost side near the bottom of the drawing. In FIGS. 27-29, the lineal or standard piece for flashing the array, but not at an edge of the array, has hidden lap alignment features. At the left end of the flashing element, a portion is thinned for a distance on the bottom of the piece, dashed lines indicating the thinning on the bottom. At the right end, the thinning is at the top. When adjacent flashing elements are installed across the array, the left end overlaps the right end of an adjacent section of flashing. The thinning of the end provides an indicator for proper lateral overlap at the end. From left to right in FIG. 27, the flashing has three zones. The two left zones go up and over the upper edge of the topmost course of the photovoltaic roofing panels in the array. The right portion is flat on the roof deck. Conventional roofing materials are installed so that they overlap at least the right uppermost portion of the top flashing to direct moisture down the roof. In some instances, the exposure zone of a conventional roofing product may extend to cover the majority, or completely cover, the top flashing elements across the photovoltaic roofing product array. FIG. 28 shows views of a right end top flashing element. The upper flat flange in the plane of the roof deck extends around to the right end beyond the raised bend feature. FIG. 29 shows views of a left end top flashing element, the flashing flange extending around to the left. The raised bend feature covers the top edge of the photovoltaic roofing array. The flanges underlie adjacent conventional roofing materials. The flashings can be formed from a variety of materials; for example, they can be molded or formed from plastic or metal.

FIG. 30 is a set of schematic views (top, back, side and front) of a right side flashing element for use with photovoltaic roofing elements of FIGS. 21, 21A and 24 according to one embodiment of the invention. The right side flashing element is installed along the right edge of a set of contiguously-disposed photovoltaic roofing elements. It includes an overlap portion 3010 and an exposed portion 3015. The top schematic view of FIG. 30 has the uppermost portion of the right flashing at the lower end of the figure. A cut-back notch 3020 is provided so that an overlying right side flashing element can fit into the underlying piece with a flush right edge. The side schematic view in FIG. 30 shows that the right side flashing element has a greater height at its lower end (left side of the side schematic view) than at its upper end, to accommodate the canting of the photovoltaic roofing elements in the course as they overlie the underlying course. The front view (i.e., looking up the roof) and the back view (i.e., looking down the roof) show downward directed ridges that interact cooperatively with the underlying drainage channel at the right side edge of the roofing panel of FIG. 21. The downward directed structures are analogous to the structures shown at the left edge of the photovoltaic roofing element of FIG. 21. The right side flashing element engages with the right side edge of the roofing panel in a shiplap fashion, with the flange (i.e., overlap portion 3010) extending under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the right side flashing elements may be suitably adapted. It will also be understood that the first horizontal portion of the inside corner flashing element can be formed as described above with respect to the exposed portion 3015.

Figure 31:
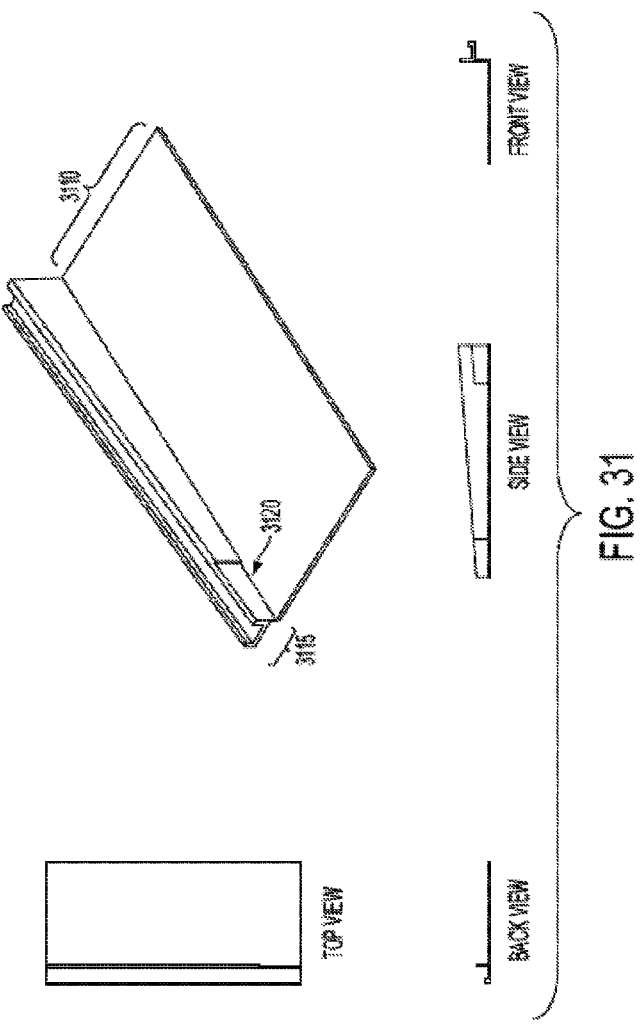

FIG. 31 is a set of schematic views (top, back, side, front and perspective) of a left side flashing element for use with photovoltaic roofing elements of FIGS. 21, 21A and 24 according to one embodiment of the invention. The left side flashing element is installed along the left edge of a set of contiguously-disposed photovoltaic roofing elements. It includes an overlap portion 3110 and an exposed portion 3115. The top view of FIG. 31 has the uppermost portion of the left side flashing element at the lower end of the figure. A cut-back notch 3120 is provided so that an overlying left side flashing element can fit into the underlying piece with a flush left edge. The side view in FIG. 31 shows that the left side flashing element has a greater height at its lower edge (at the right side of the figure) than at its upper end to accommodate the canting of the photovoltaic roofing elements in the course as they overlie the underlying course. The front view of the left side flashing element is taken looking up the roof and the back view is taken looking down the roof. The front view (i.e., looking up the roof) and the back view (i.e., looking down the roof) show the upward-directed edge ridge and drainage channel that interact cooperatively with the overlying downward-directed ridges at the left side edge of the photovoltaic roofing element of FIGS. 21, 21A and 24. The upward directed ridge and drainage channel are analogous to the structures shown at the right edge of the photovoltaic roofing element of FIG. 21. Preferably, the left side edge flashing is installed prior to installation of a leftmost photovoltaic roofing element in a course. The left side edge flashing element engages with the left side edge of the photovoltaic roofing element in a shiplap fashion and provides a flange (i.e., the overlap portion 3110) to extend under adjacent conventional roofing material to flash in and close the roof to the elements. In some embodiments, the flange extends at least about 2 inches, at least about 4 inches, at least about 6 inches, or at least about 8 inches or more under the adjacent roofing materials. It will be understood that for use with photovoltaic roofing elements of another dimension, the size and proportion of the left side flashing elements may be suitably adapted. It will also be understood that if geometries of parts of the roofing system including photovoltaic roofing elements and flashing components are reversed, such as for example by mirroring, that preferred orders of installation may also accommodate such changes. It will also be understood that the first horizontal portion of the inside corner flashing element can be formed as described above with respect to the exposed portion 3115.

While various elements are denoted "right" and "left" here, the person of skill in the art will appreciate that they may be provided in mirror image form.

In another embodiment of the invention, a photovoltaic roofing system further includes one or more top flashing elements disposed along the top edge of the first course of contiguously-disposed photovoltaic roofing elements that extends away from the second horizontal portion of the inside corner flashing element, the one or more top flashing elements having a bottom end disposed over the top edge of the contiguously-disposed photovoltaic roofing elements; and a top end disposed under one or more inactive roofing elements disposed along the top edge of the contiguously-disposed photovoltaic roofing elements. For example, in the embodiment of FIGS. 20A and 20B, a top flashing element 2055 is disposed along the top edge of the first course of contiguously-disposed photovoltaic roofing elements that extends away from the second horizontal portion of the 2040 of the inside corner flashing element 2030. The bottom end of the top flashing element 2055 is disposed over the top edge of the contiguously disposed photovoltaic roofing elements of the first course that extends away from second horizontal portion 2040 of the inside corner flashing element. The top end of the top flashing element 2055 is disposed under one or more inactive roofing elements 2050 disposed along the top edge of the contiguously-disposed photovoltaic roofing elements of the first course. In certain embodiments, the top flashing and the second horizontal portion of the inside corner flashing element overlap, for example, as described above with respect to FIGS. 27-29.

In preferred photovoltaic roofing systems the parts are available in modular components that fit together and can be kitted in advance to minimize the need for fabrication on site. For example, flashing components and cant strips, in this instance, are provided in lengths that are integral multiples of the dimensions of the photovoltaic roofing elements or partial photovoltaic roofing element sizes to accommodate predetermined arrays for the roofing system in dimensions and power ratings suitable for a particular roofing project. Accordingly, assembly on the roof can be simplified.

Any cabling or wiring interconnecting the photovoltaic roofing elements of the invention in a photovoltaic roofing system can, for example, be long and flexible enough to account for natural movement of a roof deck, for example due to heat, moisture and/or natural expansion/contraction. The cabling or wiring can be provided as part of a photovoltaic roofing element, or alternatively as separate components that are interconnected with the photovoltaic roofing elements (e.g., through electrical connectors) during installation.

Examples of electrical connectors that can be suitable for use or adapted for use in practicing various embodiments of the invention are available from Kyocera, Tyco Electronics, Berwyn, Pa. (trade name Solarlok) and Multi-Contact USA of Santa Rosa, Calif. (trade name Solarline). U.S. Pat. Nos. 7,445,508 and 7,387,537, U.S. Patent Application Publications nos. 2008/0271774, 2009/0126782, 2009/0133740, 2009/0194143 and 2010/0146878, each of which is hereby incorporated herein by reference in its entirety, disclose electrical connectors for use with photovoltaic roofing products. Of course, other suitable electrical connectors can be used. Electrical connectors desirably meet UNDERWRITERS LABORATORIES and NATIONAL ELECTRICAL CODE standards.

In certain embodiments, the photovoltaic roofing elements of the array are electrically interconnected. The interconnected photovoltaic array can be interconnected with one or more inverters to allow photovoltaically-generated electrical power to be used on-site, stored in a battery, or introduced to an electrical grid. For example, a single inverter can be used to collect the photovoltaically-generated power and prepare it for further use. In other embodiments, the photovoltaic roofing elements can be interconnected with a plurality of micro-inverters disposed on the roof. For example, a single micro-inverter can be used for each photovoltaic roofing element; or a single micro-inverter can be used for a group of photovoltaic roofing elements.

Another aspect of the invention is a roof comprising a roof deck and a photovoltaic roofing system as described herein disposed on the roof deck. The photovoltaic roofing systems described herein can be utilized with many different building structures, including residential, commercial and industrial building structures.

There can be one or more layers of material (e.g. underlayment), between the roof deck and the photovoltaic modules. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements. Standard roofing elements can be interleaved at the edges of the photovoltaic arrays described herein. In certain embodiments, the photovoltaic roofing elements are simply disposed on top of an already-installed array of standard roofing elements (e.g., an already-shingled roof).

Another aspect of the invention is a kit for the installation of a photovoltaic roofing system, the kit comprising a plurality of photovoltaic roofing elements as described herein, a plurality of side flashing elements and inside corner flashing elements as described herein, adapted to be assembled together with the photovoltaic roofing elements of the kit to provide a photovoltaic roofing system as described herein. The kit can further include a plurality of top flashing elements as described herein. Further details of elements of kits according to various aspects of the present invention are described in U.S. patent application Ser. Nos. 13/326,081, 13/326,094 and 61/559,614, each of which is hereby incorporated herein by reference in its entirety. Accordingly, in one embodiment, a kit includes a plurality of photovoltaic roofing elements;
a plurality of side flashing elements; and a plurality of inside corner flashing elements, each inside corner flashing element having a top edge, a first horizontal portion having a first side edge and a bottom edge, a second horizontal portion horizontally adjacent the first horizontal portion, the second horizontal portion having a second side edge opposing the first side edge and a bottom edge adjacent the bottom edge of the first horizontal portion, the first horizontal portion comprising a horizontally-extending flange adapted to form a water-resistant interface with a photovoltaic roofing element at the first side edge of the second course, the second horizontal portion being adapted to overlap the top edge of a photovoltaic roofing element of the first course.

Another aspect of the invention is a method for installing a photovoltaic array comprising disposing on a surface (e.g., a roof) and electrically interconnecting a plurality of photovoltaic modules as described herein. The disposal on the surface and electrical interconnections can be performed in any desirable order. The method can further include disposing a cover over substantially laterally aligned electrical elements of the photovoltaic array. In other embodiments, the method can comprise placement of wiring within wiring containment structures as described herein. Accordingly, one embodiment of the invention is a method for installing a photovoltaic roofing system on a roof deck having a top end and a bottom end, the method comprising:

disposing the photovoltaic roofing elements on the roof deck to provide a first course comprising one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, and two side edges; and a second course horizontally offset from the first course, the second course comprising one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge disposed up the roof from the top edge of the one or more contiguously-disposed photovoltaic roofing elements of the first course, thereby forming an inside corner; and a second side edge opposing the first side edge; and disposing on the roof an inside corner flashing element having a top edge, a first horizontal portion having a first side edge and a bottom edge, a second horizontal portion horizontally adjacent the first horizontal portion, the second horizontal portion having a second side edge opposing the first side edge and a bottom edge adjacent the bottom edge of the first horizontal portion, the first horizontal portion comprising a horizontally-extending flange, such that the horizontally-extending flange forms a water-resistant interface with the photovoltaic roofing element at the first side edge of the second course, and the second horizontal portion overlaps the top edge of a photovoltaic roofing element of the first course; and disposing a roofing element adjacent the first side edge of the second course and on top of the second horizontal portion of the inside corner flashing element.

Figure 32:
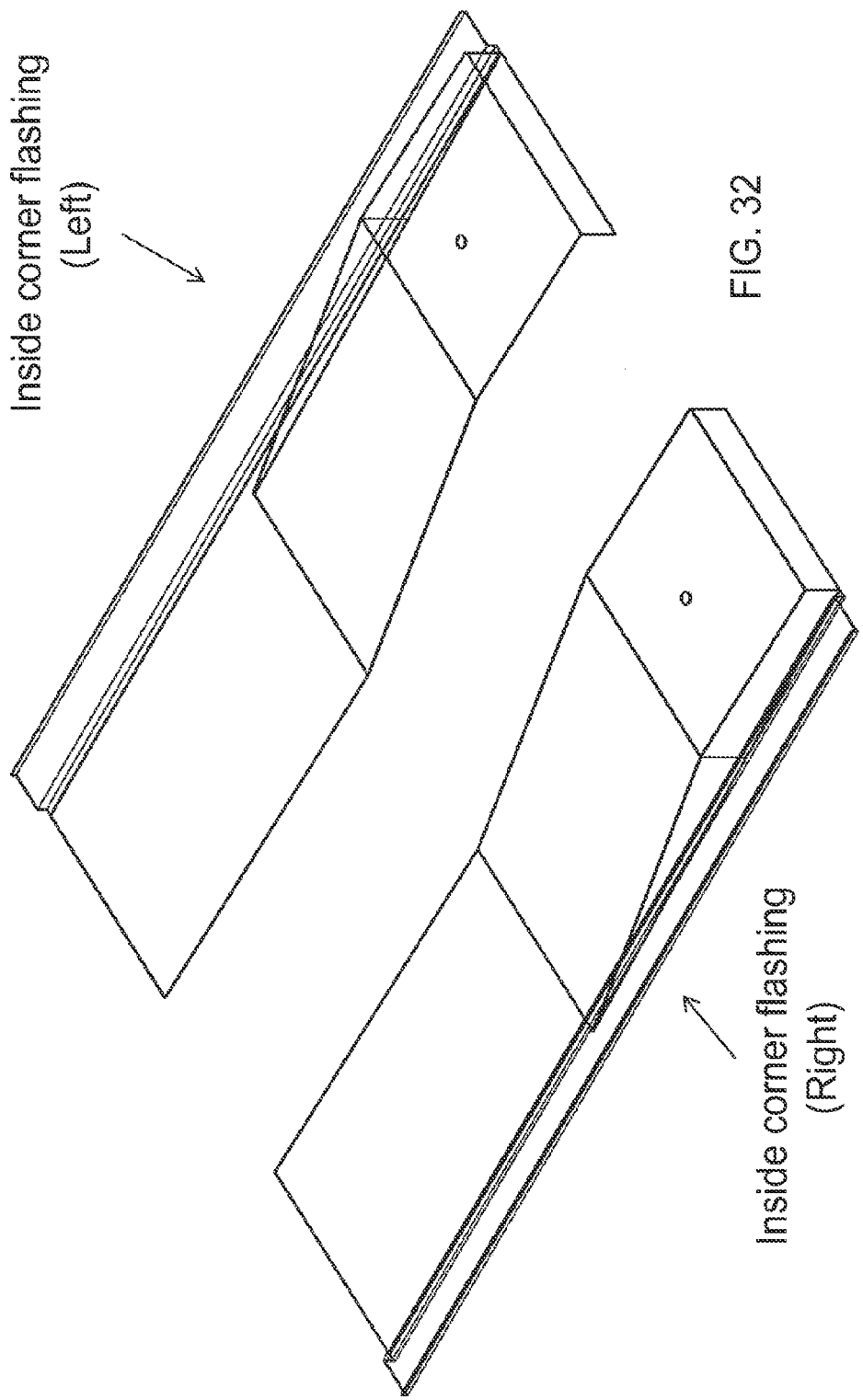
FIGS. 32-36 are various views of examples of inside corner flashing elements according to various embodiments of the invention.
Figure 33:
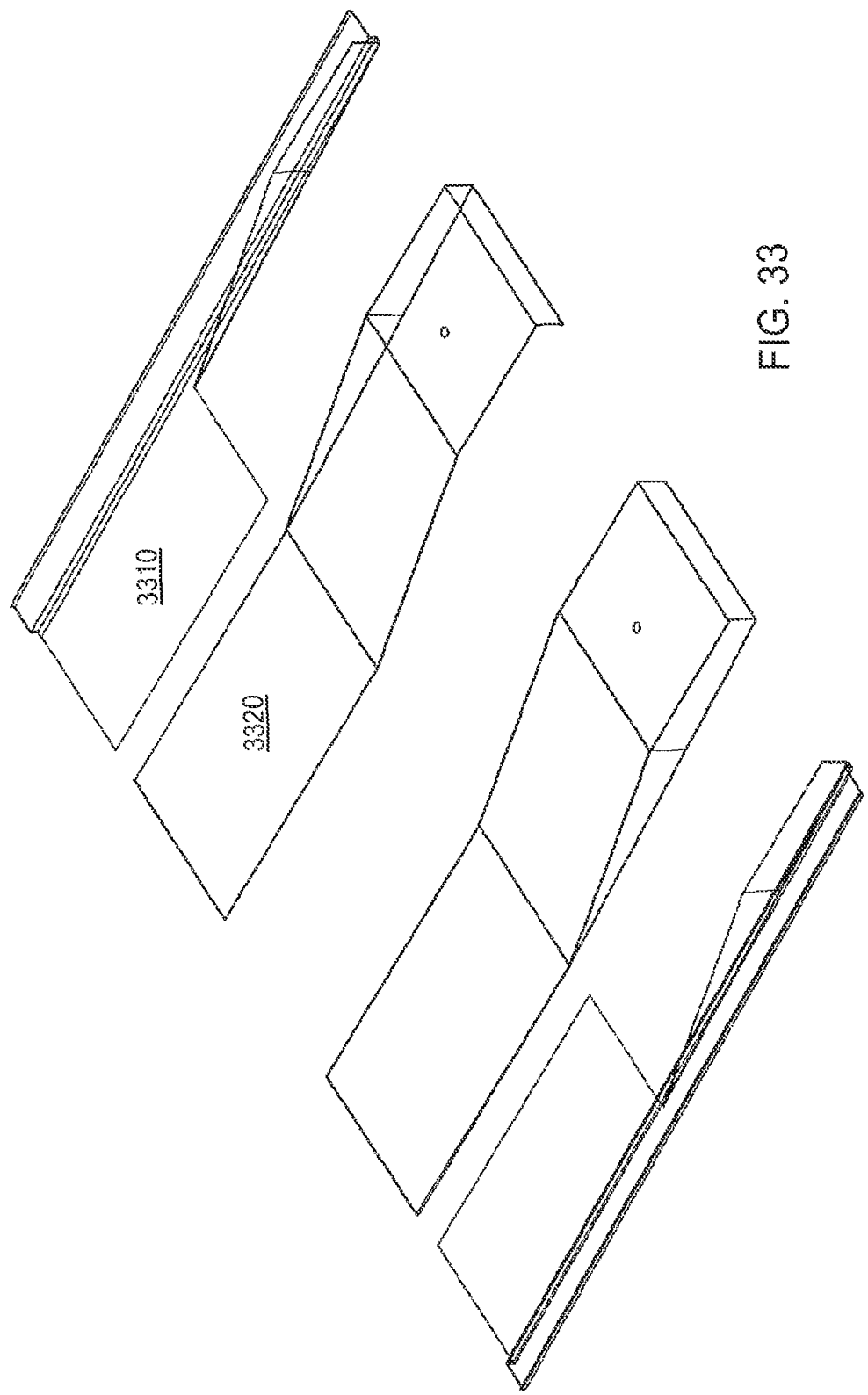
Figure 34:
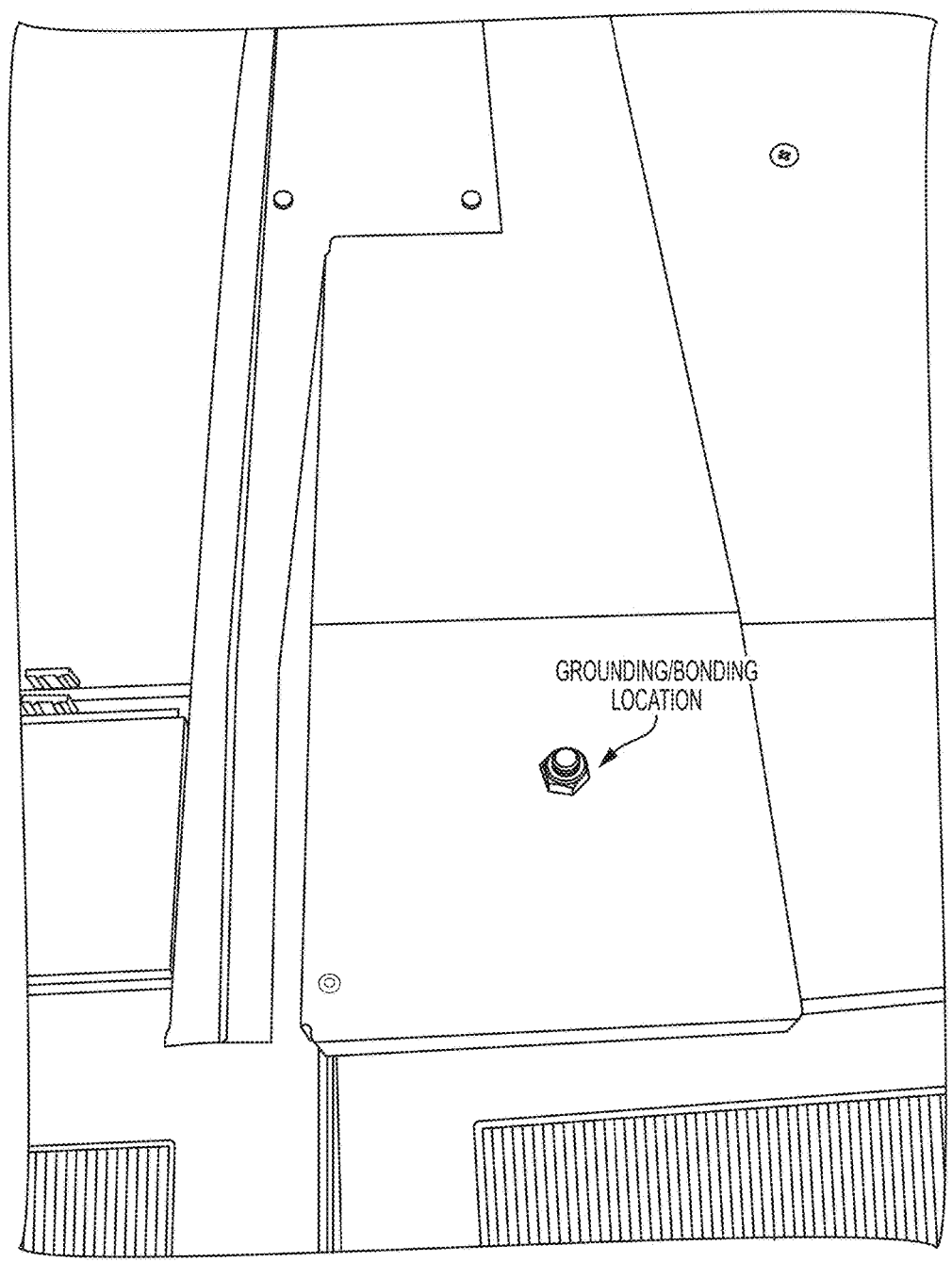
Figure 35:
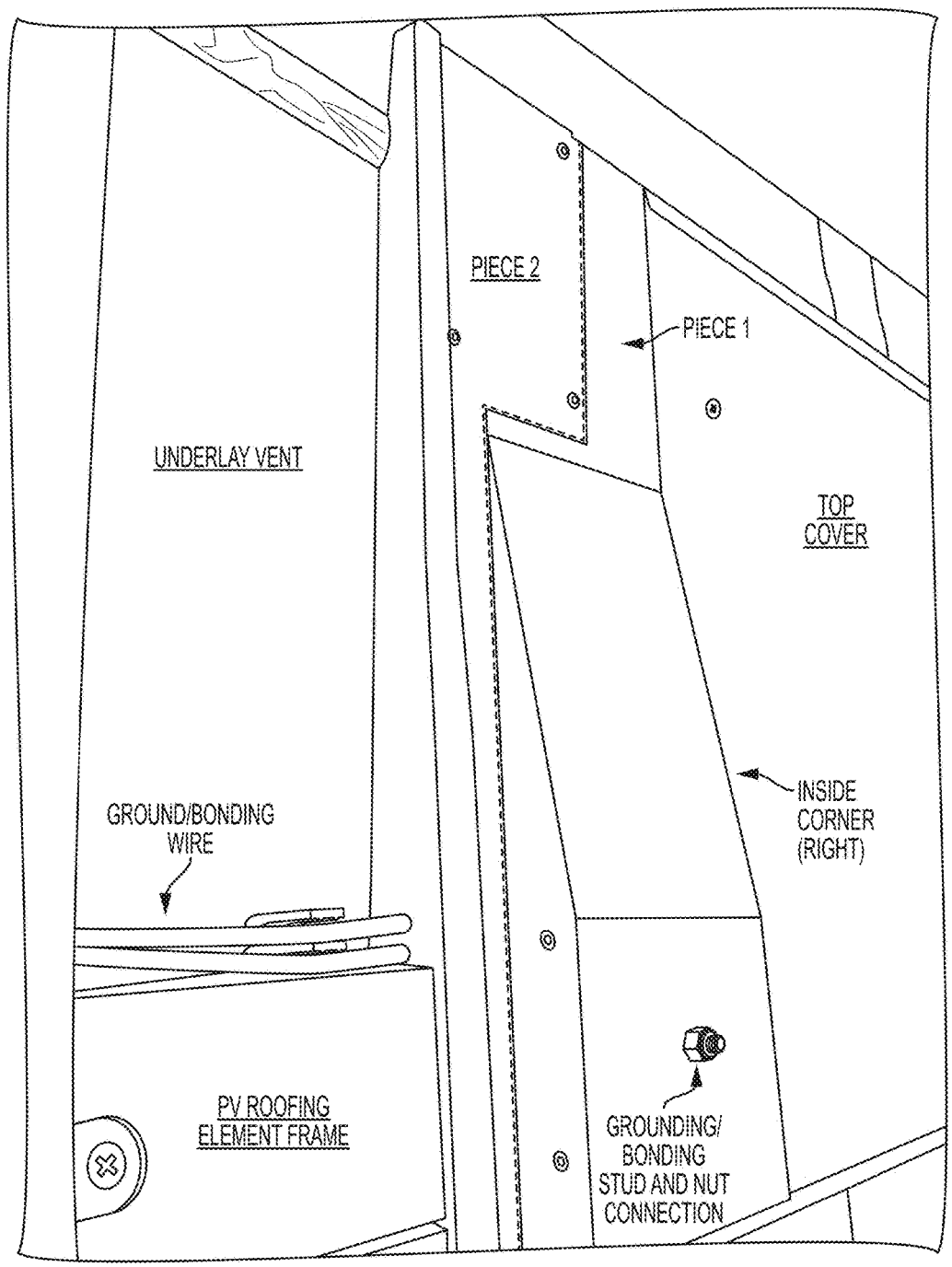
Figure 36:
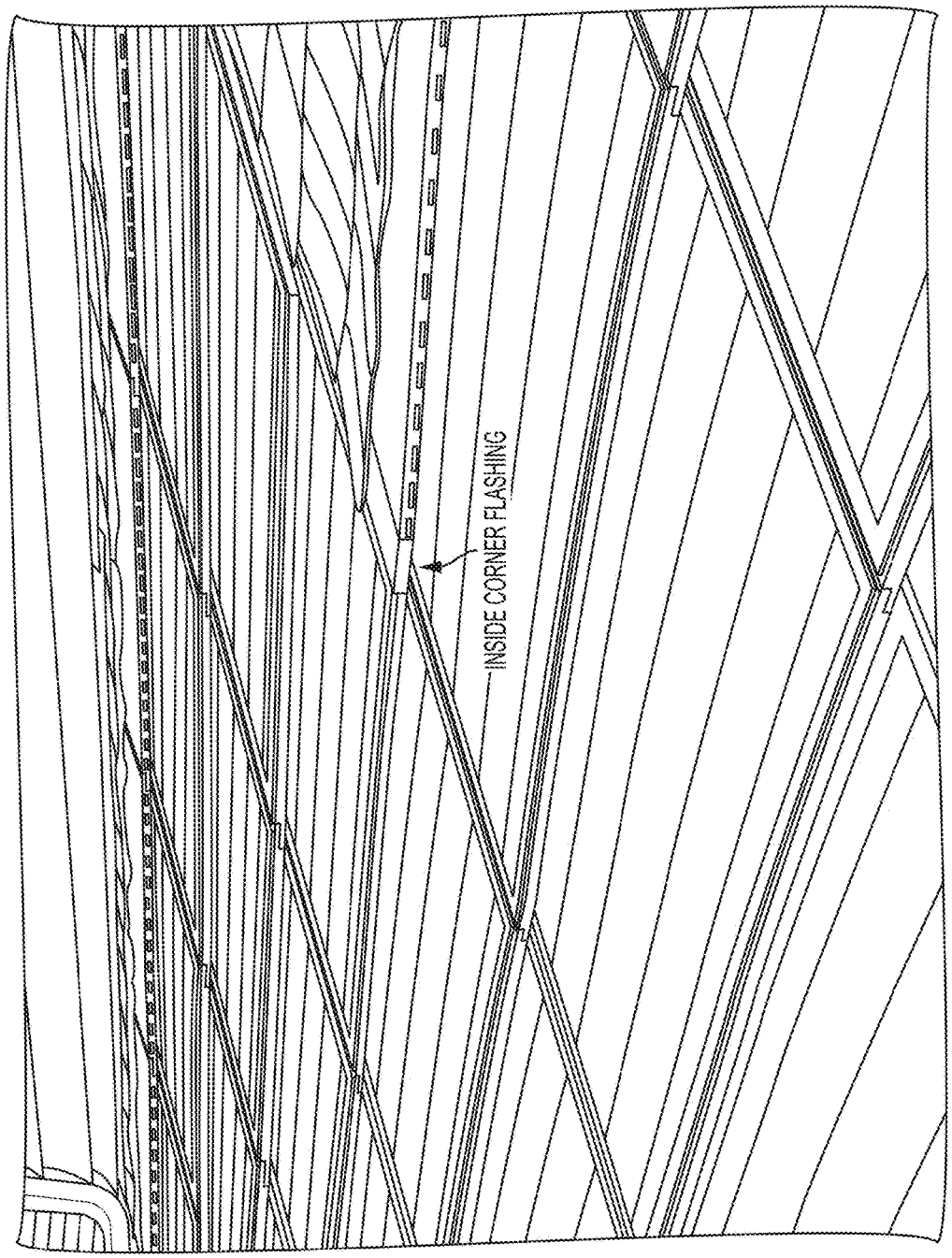

Examples of inside corner flashing elements are shown in FIGS. 32-36. FIG. 32 is a perspective view of left and right inside corner flashing elements according to one embodiment of the invention. In these embodiments, the edge of the second horizontal portion is open, such that the second horizontal portion can overlap with an adjacent top flashing. In the embodiment of FIG. 32, the inside corner flashing elements are shown as being formed as a unitary piece. The holes can be used as a location for electrical grounding. In the exploded perspective view of FIG. 33, two inside corner flashing elements are shown as being formed from two pieces, which overlap one another. That is, piece 3310 overlaps piece 3320 at their top edges. FIGS. 34 and 35 are pictures of an inside corner flashing element as installed, overlapping a first course of photovoltaic roofing elements (bottom of picture), and with its first horizontal portion (at the left) ready to be covered by the edge of a photovoltaic roofing element of a second course (not shown). The second horizontal portion overlaps a top flashing element disposed to the left of the inside corner flashing element. FIG. 36 shows the inside corner flashing element as installed, together with inactive roofing elements (here, shingles).

Another aspect of the invention is an inside corner flashing element adapted for use with a photovoltaic roofing system comprising a first course comprising one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, and two side edges; and a second course horizontally offset from the first course, the second course comprising one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge disposed up the roof from the top edge of the one or more contiguously-disposed photovoltaic roofing elements of the first course, thereby forming an inside corner; and a second side edge opposing the first side edge; and a roofing element disposed adjacent the first side edge of the second course, the inside corner flashing element comprising a top edge, a first horizontal portion having a first side edge and a bottom edge, a second horizontal portion horizontally adjacent the first horizontal portion, the second horizontal portion having a second side edge opposing the first side edge and a bottom edge adjacent the bottom edge of the first horizontal portion, the first horizontal portion comprising a horizontally-extending flange, the horizontally-extending flange being adapted to form a water-resistant interface with the photovoltaic roofing element at the first side edge of the second course, the second horizontal portion being adapted to overlap the top edge of a photovoltaic roofing element of the first course and to underlie the roofing element disposed adjacent the first side edge of the second course.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

What is claimed is:

1. A photovoltaic roofing system disposed on a roof deck having a top end, a bottom end, a first lateral side and a second lateral side opposing the first lateral side, the photovoltaic roofing system comprising:
    a first course comprising one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, a first side edge facing the first lateral side of the roof deck, and a second side edge opposing the first side edge and facing the second lateral side of the roof deck;
    a second course horizontally offset from the first course, the second course comprising one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge facing the first lateral side of the roof deck, the first side edge being laterally offset from the first side edge of the one or more contiguously-disposed photovoltaic roofing elements of the first course, such that the first side edge of the one or more contiguously-disposed photovoltaic roofing elements of the second course is disposed up the roof from an interior portion of the top edge of the one or more contiguously-disposed photovoltaic roofing elements of the first course, thereby forming an inside corner between the first side edge of the one or more contiguously-disposed photovoltaic roofing elements of the second course and the interior portion of the top edge of the one or more contiguously-disposed photovoltaic roofing elements of the first course; and a second side edge opposing the first side edge and facing the second lateral side of the roof deck;
    an inside corner flashing element having a top edge, a first horizontal portion having a first side edge facing the second lateral side of the roof deck and a bottom edge, a second horizontal portion horizontally adjacent the first horizontal portion, the second horizontal portion having a second side edge opposing the first side edge of the first horizontal portion and facing the first lateral side of the roof deck, and a bottom edge adjacent the bottom edge of the first horizontal portion, the second horizontal portion having a height with respect to the roof deck, the height being tapered along a direction from its bottom edge toward its top edge with the height being less towards the top edge than it is towards the bottom edge, the first horizontal portion comprising a horizontally-extending flange forming a water-resistant interface with the photovoltaic roofing element at the first side edge of the one or more contiguously-disposed photovoltaic roofing elements of the second course, the second horizontal portion overlapping the top edge of a photovoltaic roofing element of the first course at an interior portion of the top edge of the one or more contiguously-disposed photovoltaic roofing elements of the first course; and
    an inactive roofing element disposed adjacent the first side edge of the second course and on top of the second horizontal portion of the inside corner flashing element.

2. The photovoltaic roofing system of claim 1, wherein a height with respect to the roof deck of the second horizontal portion of the inside corner flashing element is continuously tapered from its bottom edge toward its top edge.

3. The photovoltaic roofing system of claim 1, wherein a height with respect to the roof deck of the second horizontal portion of the inside corner flashing element is tapered along only a portion of the distance from the bottom edge to the top edge.

4. The photovoltaic roofing system of claim 1, wherein the horizontally-extending flange of the first horizontal portion of the inside corner flashing element forms a water-resistant interface with the photovoltaic roofing element at the first side edge of the second course by being disposed under it.

5. The photovoltaic roofing system claim 1, wherein the horizontally-extending flange of the first horizontal portion of the inside corner flashing element overlaps the top edge of a photovoltaic roofing element of the first course.

6. The photovoltaic roofing system of claim 1, wherein the second horizontal portion of the inside corner flashing element forms a cavity over the top edge of the photovoltaic roofing element of the first course, the cavity having a thickness in the range of about 1 cm to about 15 cm.

7. The photovoltaic roofing system of claim 1, wherein the top surface of the second horizontal portion of the inside corner flashing element is disposed at a level in the range of about 1 cm to about 15 cm higher than the horizontally-extending flange of the first horizontal portion, at least at its bottom edge.

8. The photovoltaic roofing system of claim 1, wherein the inside corner flashing element is formed as a unitary piece.

9. The photovoltaic roofing system of claim 1, wherein the inside corner flashing element is formed as a plurality of pieces.

10. The photovoltaic roofing system of claim 1, wherein the inside corner forms an angle of about 90°.

11. The photovoltaic roofing system of claim 1, wherein the second horizontal portion of the inside corner flashing element is disposed over a horizontal joint between two adjacent photovoltaic roofing elements of the first course.

12. The photovoltaic roofing system according to claim 1, wherein each photovoltaic roofing element comprises
    a frame structure having an upward-facing surface and a downward-facing surface, the frame structure having an attachment zone and an exposure zone, with the exposure zone disposed toward the bottom end of the frame structure, and the attachment zone disposed toward the top end of the frame structure; and
    one or more photovoltaic elements held in the exposure zone of the frame structure.

13. The photovoltaic roofing system according to claim 12, wherein the sidelap portions of the photovoltaic roofing elements interlock to provide water drainage channels.

14. The photovoltaic roofing system according to claim 1, further comprising a top flashing element disposed along the top edge of the first course of contiguously-disposed photovoltaic roofing elements that extends away from the second horizontal portion of the inside corner flashing element, the top flashing element having a bottom end disposed over the top edge of one or more of the contiguously-disposed photovoltaic roofing elements of the first course; and a top end disposed under one or more roofing elements disposed along the top edge of the one or more of the contiguously-disposed photovoltaic roofing elements of the first course, wherein the second horizontal portion of the inside corner flashing element and the top flashing element are arranged in an overlapping manner with respect to one another.

15. The photovoltaic roofing system according to claim 14, wherein the second horizontal portion of the inside corner flashing element overlaps the top flashing element.

16. The photovoltaic roofing system of claim 1, wherein the horizontally-extending flange of the first horizontal portion of the inside corner flashing element forms a water-resistant interface with the photovoltaic roofing element at the first side edge of the second course by being disposed under it, and wherein the horizontally-extending flange of the first horizontal portion of the inside corner flashing element overlaps the top edge of a photovoltaic roofing element of the first course.

17. A method for installing a photovoltaic roofing system according to claim 1 on a roof deck having a top end, a bottom end, a first lateral side and a second lateral side opposing the first lateral side, the method comprising:
   disposing the photovoltaic roofing elements on the roof deck to provide
      a first course comprising one or more photovoltaic roofing elements, contiguously disposed in a horizontal row on the roof deck, the one or more contiguously-disposed photovoltaic roofing elements of the first course together having a top edge facing the top end of the roof deck, a bottom edge facing the bottom end of the roof deck, a first side edge facing the first lateral side of the roof deck, and a second side edge opposing the first side edge and facing the second lateral side of the roof deck; and
      a second course horizontally offset from the first course, the second course comprising one or more photovoltaic roofing elements, contiguously disposed in a horizontal row on the roof deck, the one or more contiguously disposed photovoltaic roofing elements of the second course together having a bottom edge facing the bottom end of the roof deck and at least partially overlapping the top edge of the one or more contiguously-disposed photovoltaic roofing elements of the first course, the one or more contiguously disposed photovoltaic roofing elements of the second course together having a first side edge facing the first lateral side of the roof deck, the first side edge being laterally offset from the first side edge of the one or more contiguously-disposed photovoltaic roofing elements of the first course, such that the first side edge of the one or more contiguously-disposed photovoltaic roofing elements of the second course is disposed up the roof an interior portion of from the top edge of the one or more contiguously-disposed photovoltaic roofing elements of the first course, thereby forming an inside corner between the first side edge of the one or more contiguously-disposed photovoltaic roofing elements of the second course and the interior portion of the top edge of the one or more contiguously-disposed photovoltaic roofing elements of the first course; and a second side edge opposing the first side edge and facing the second lateral side of the roof deck; and
   disposing on the roof an inside corner flashing element having a top edge, a first horizontal portion having a first side edge facing the second lateral side of the roof deck and a bottom edge, a second horizontal portion horizontally adjacent the first horizontal portion, the second horizontal portion having a second side edge opposing the first side edge of the first horizontal portion and facing the first lateral side of the roof deck, and a bottom edge adjacent the bottom edge of the first horizontal portion, the second horizontal portion having a height with respect to the roof deck, the height being tapered along a direction from its bottom edge toward its top edge with the height being less towards the top edge than it is towards the bottom edge, the first horizontal portion comprising a horizontally-extending flange, such that the horizontally-extending flange forms a water-resistant interface with the photovoltaic roofing element at the first side edge of the one or more contiguously-disposed photovoltaic roofing elements of the second course, and the second horizontal portion overlaps the top edge of a photovoltaic roofing element of the first course at an interior portion of the top edge of the one or more contiguously-disposed photovoltaic roofing elements of the first course; and
   disposing an inactive roofing element adjacent the first side edge of the second course and on top of the second horizontal portion of the inside corner flashing element.

* * * * *